US012646688B2

(12) United States Patent
Torbatisarraf et al.

(10) Patent No.: US 12,646,688 B2
(45) Date of Patent: Jun. 2, 2026

(54) SHOWERHEAD FOR A SEMICONDUCTOR MANUFACTURING SYSTEM

(71) Applicant: Lam Research Corporation, Fremont, CA (US)

(72) Inventors: Seyedalireza Torbatisarraf, San Jose, CA (US); Kurt Alan Kern, San Jose, CA (US); Dennis Smith, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 342 days.

(21) Appl. No.: 17/770,968

(22) PCT Filed: Oct. 21, 2020

(86) PCT No.: PCT/US2020/056710
§ 371 (c)(1),
(2) Date: Apr. 21, 2022

(87) PCT Pub. No.: WO2021/081123
PCT Pub. Date: Apr. 29, 2021

(65) Prior Publication Data
US 2022/0384145 A1 Dec. 1, 2022

Related U.S. Application Data

(60) Provisional application No. 62/925,419, filed on Oct. 24, 2019.

(51) Int. Cl.
*H01J 37/32* (2006.01)
*B23P 13/00* (2006.01)
(Continued)

(52) U.S. Cl.
CPC .......... *H01J 37/3244* (2013.01); *B23P 13/00* (2013.01); *B23P 15/00* (2013.01); *B23P 17/00* (2013.01);
(Continued)

(58) Field of Classification Search
CPC ........ C23C 16/45563; C23C 16/45565; C23C 16/45574
See application file for complete search history.

(56) References Cited

U.S. PATENT DOCUMENTS

| | | | | |
|---|---|---|---|---|
| 6,461,435 B1 * | 10/2002 | Littau | .................. | C23C 16/455 118/724 |
| 8,216,640 B2 * | 7/2012 | Chao | .................. | C23C 16/4404 427/249.4 |

(Continued)

FOREIGN PATENT DOCUMENTS

| | | |
|---|---|---|
| KR | 20120016955 | 2/2012 |
| KR | 102891158 B1 | 11/2025 |
| WO | 2019089764 | 5/2019 |

OTHER PUBLICATIONS

International Application Serial No. PCT/US2020/056710, International Preliminary Report on Patentability mailed May 5, 2022, 6 pgs.

(Continued)

*Primary Examiner* — Sarang Afzali
(74) *Attorney, Agent, or Firm* — Schwegman Lundberg & Woessner, P.A.

(57) ABSTRACT
Methods, systems, and computer programs for manufacturing a showerhead for a semiconductor manufacturing system are presented herein. One method includes an operation for drilling first holes on a faceplate made of a first material, where the first holes have a first diameter. Further, the method includes an operation for cladding the first holes and the faceplate with a second material to cover the first holes
(Continued)

and the faceplate with the second material. Further yet, the method includes drilling second holes concentric with the first holes resulting in a part with holes coated with the second material. The second holes have a second diameter that is smaller than the first diameter. Additionally, the method includes an operation for creating the showerhead utilizing the part, where gas is deliverable through the second holes of the faceplate in the showerhead.

4 Claims, 22 Drawing Sheets

(51) Int. Cl.
B23P 15/00 (2006.01)
B23P 17/00 (2006.01)
C23C 16/455 (2006.01)

(52) U.S. Cl.
CPC .. C23C 16/45574 (2013.01); H01J 37/32091 (2013.01); H01J 37/32165 (2013.01)

(56) References Cited

U.S. PATENT DOCUMENTS

| | | | |
|---|---|---|---|
| 9,484,190 B2 * | 11/2016 | Glukhoy | H01J 37/32091 |
| 10,658,722 B2 * | 5/2020 | Tamiazzo | H01P 1/205 |
| 2002/0088545 A1 | 7/2002 | Lee et al. | |

| | | | |
|---|---|---|---|
| 2011/0076401 A1 | 3/2011 | Chao et al. | |
| 2011/0253044 A1 | 10/2011 | Tam et al. | |
| 2012/0074110 A1 | 3/2012 | Zediker et al. | |
| 2013/0118405 A1 | 5/2013 | Ho et al. | |
| 2014/0117120 A1 * | 5/2014 | He | C23C 14/32 |
| | | | 239/548 |
| 2017/0301515 A1 | 10/2017 | Madsen et al. | |
| 2019/0085458 A1 | 3/2019 | Tsuno et al. | |

OTHER PUBLICATIONS

International Application Serial No. PCT/US2020/056710, International Search Report mailed Feb. 10, 2021, 7 pgs.

International Application Serial No. PCT/US2020/056710, Written Opinion mailed Feb. 10, 2021, 4 pgs.

"Chinese Application Serial No. 202080074441.X, Office Action mailed Oct. 29, 2024", W English Translation, 19 pgs.

"Korean Application Serial No. 10-2022-7017072, Notice of Preliminary Rejection mailed Jan. 27, 2025", W English Translation, 29 pgs.

"Korean Application Serial No. 10-2022-7017072, Voluntary Amendment filed Oct. 18, 2023", w English claims, 4 pgs.

Korean Application Serial No. 10-2022-7017072, Response filed Mar. 26, 2025 to Notice of Preliminary Rejection mailed Jan. 27, 2025, W/English Claims, 48 pgs.

"Chinese Application Serial No. 202080074441.X, Response to Examiner Telephone Interview filed Mar. 21, 2025", w English claims, 6 pgs.

* cited by examiner

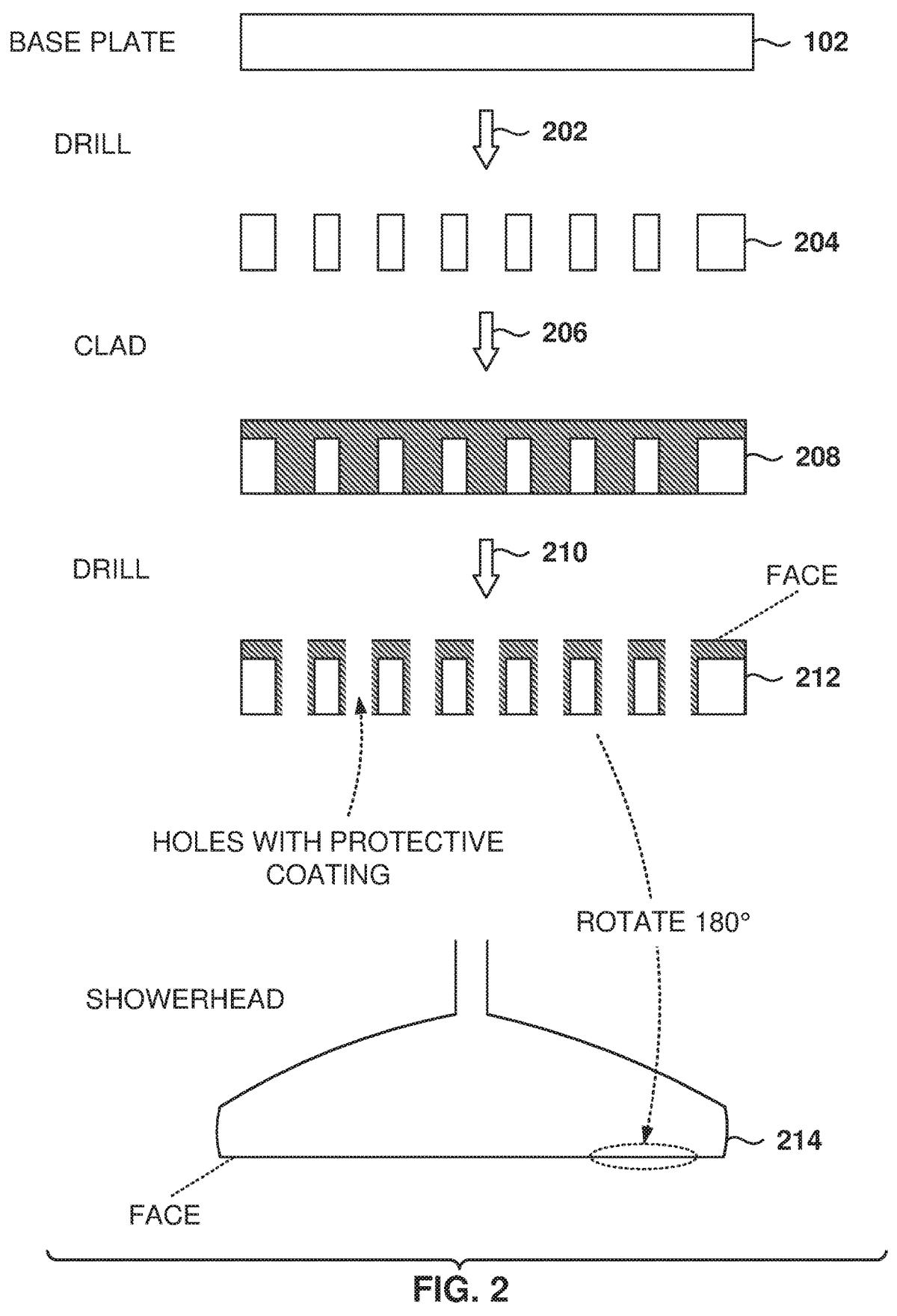

BASE PLATE     ~ 102

DRILL     ~ 202

~ 204

CLAD     ~ 206

~ 208

DRILL     ~ 210     FACE

~ 212

HOLES WITH PROTECTIVE COATING

ROTATE 180°

SHOWERHEAD

~ 214

FACE

FIG. 2

BASE PLATE — 102

MACHINING FOR FEATURES — 302

— 304

EMBED FEATURES — 306

318     320

— 308

MELD TO COVER FEATURES — 310

— 312

REPEAT — 314

— 316

MULTILAYER STRUCTURE WITH
EMBEDDED FEATURES

FEATURE CAN BE IMBEDDED AT DIFFERENT
DEPTHS

EXAMPLE OF HEATER + COOLER

BASEPLATE

102

320

H2

C2

318

C1

H1

SCHEMATIC OF CROSS SECTION OF SUPER HEATER-COOLER WITH MULTILAYER MONOLITHIC MATERIAL

SCHEMATIC OF CROSS SECTION OF SUPER HEATER-COOLER WITH MULTILAYER FGM MATERIAL

902

904

MELD N

MELD N-1

MELD 1

BASE

1002

102

CONTROL OF HEAT TRANSFER, WEIGHT, AND CHEMICAL REACTIONS WITH DIFFERENT LAYERS

WITH MELD, EACH LAYER CAN BE OF A DIFFERENT MATERIAL WITH DIFFERENT PROPERTIES (E.G., DIFFUSIVITY)

SUPER HEATER/COOLER

SUPER HEATER COOLER TUBE WITH
CAPABILITY TO CARRY GAS OR LIQUID AND
USA AS SHEATH FOR CONTROLLING
TEMPERATURE OF OTHER TOOLS

SUPER HEATER/COOLER WITH
GAS DISPENSER

HEATER/COOLER

MAKE HOLLOW CENTER
AND FINE MACHINE TO
OPEN A GROOVE OFF THE
TUBE

GAS DISPENSER

HEATER/COOLER

GIANT FLAT HEATER/COOLER PLATE WITH GAS DELIVERY

MACHINING BASE AT TWO DIFFERENT LEVELS

INSERT FEATURES AT DIFFERENT LEVELS

PROLIFERATE PATTERN TO THE WHOLE SURFACE

TRUNCATE TOP TO OPEN UP THE FEATURE

ALD LINER WITH EMBODIED PURGE-GAS SYSTEM

FILLER MATERIAL THROUGH MELD

1802

1804

SEAL FOR THE CHANNEL (FSW)

1808

1806

MACHINED BLOCK

1800

2000

MACHINE A FIRST GROOVE ALONG A SURFACE OF A BASEPLATE, WHEREIN THE FIRST GROOVE BEGINS ON A FIRST END AND ENDS ON A SECOND END, THE FIRST END AND THE SECOND END BEING ON A SAME SIDE OF THE BASEPLATE ~2002

PLACE A FIRST TUBE ON THE GROOVE, THE FIRST TUBE COVERING THE GROOVE FROM THE FIRST END TO THE SECOND END ~2004

DEPOSIT A FIRST LAYER ABOVE THE BASEPLATE AND THE FIRST TUBE USING SOLID-STEATE ADDITIVE MANUFACTURING TECHNIQUES, THE FIRST LAYER COMPLETELY COVERING THE FIRST TUBE, WHEREIN THE FIRST TUBE IS CONFIGURED FOR CARRYING A FLUID THROUGH THE PART ~2006

FIG. 20

SHOWERHEAD FOR A SEMICONDUCTOR MANUFACTURING SYSTEM

CLAIM OF PRIORITY

This application is a U.S. National Stage Filing under 35 U.S.C. 371 from International Application No. PCT/US2020/056710, filed on Oct. 21, 2020, and published as WO 2021/081123 A1 on Apr. 29, 2021, which claims the benefit of priority under 35 U.S.C. § 119 (e) to U.S. Patent Application Ser. No. 62/925,419, filed on Oct. 24, 2019, each of which is incorporated by reference herein in its entirety.

TECHNICAL FIELD

The subject matter disclosed herein generally relates to methods, systems, and machine-readable storage media for manufacturing parts for equipment used in semiconductor manufacturing.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In semiconductor manufacturing equipment, fluid channels are embedded into some components of the chamber to bring gasses or liquids in or out of the chamber to heat up or cool down some areas. These channels are manufactured via cast-in, machining, and brazed layers. However, there may be several problems associated with cast-in structures (e.g., made of Aluminum A356), such as a reduced precision for setting the location of tube or heater structures, elemental contamination from braze foils when brazing layers together, delicate and expensive braze foils, long processing times for making the parts, and capital-intensive manufacturing methods.

In addition, cast-in and brazed structures impose limits on the size for these parts.

SUMMARY

Some examples are based on, or include, friction stir welding additive manufacturing techniques. For example, MELD additive manufacturing is an additive manufacturing technology, based on solid-state plastic deformation and diffusion bonding, to form multi-layer structures, but any other friction stir welding additive manufacturing may be utilized.

In some examples, solid-state additive manufacturing is similar to a friction-based joining process performed at low temperatures, and this solid-state additive manufacturing method has the advantage of lower residual stress and superior microstructural uniformity desired for post processing, such as anodizing. Solid-state additive manufacturing of equipment parts may shorten manufacturing lead times and simplify manufacturing through computer numeric control (CNC) processing.

Using solid-state additive manufacturing, it is possible to make heater, cooler, gas-dispenser, or multi-task parts that often cannot be made using conventional manufacturing methods or might be too expensive to make. With solid-state additive manufacturing, it is possible to create features inside solid materials as layers are added one at a time. These features include, but are not limited to, heater elements, cooling tubes, and tube or tubeless gas channels.

Additionally, it is possible to use several types of metals, alloys (similar or dissimilar) or composites in each of the layers to create functionally graded materials (FGM) that offer different properties (e.g., heat, conductivity, reaction to plasma) on the different surfaces of the parts.

Building example parts with embedded features using solid-state additive manufacturing provides the following benefits:

- Greater flexibility in using Aluminum AA6061 and AA3003 in instances where traditionally only Al 356 can be used;
- Greater precision for placement of internal structures within parts;
- Enhanced ability to insert several types of similar or dissimilar features in one part;
- Substantial elimination of elemental contamination caused by braze foils and high silicon cast alloys;
- Reduction of costs because of shorter processing times and minimum usage of materials;
- Reduction of costs by incorporating solid-state additive manufacturing equipment into existing metal-machining operations, thereby enabling vertical process integration at equipment suppliers;
- An ability to adopt computer numerical control (CNC) techniques for solid-state additive processing without having to invest in casting molds. Also, in some examples, no tooling for brazing is required with little or no cost associated with bulk heating furnaces;
- Reduced or no lead time required for casting molds and tooling associated with brazing development in CNC processes;
- In some CNC processes, operational tach-time is much shorter than casting and brazing. Further, solid-state additive manufacturing is closer to being able to provide machining tolerances than casting or brazing techniques.

One general aspect includes a method for manufacturing a part with an embedded feature. The method includes an operation for machining a first groove along a surface of a baseplate. The first groove begins at a first end and ends on a second end, the first end and the second end being on a same side of the baseplate. Further, the method includes an operation for placing a first tube in or on the groove. The first tube covers the groove from the first end to the second end. Further yet, the method includes an operation for depositing a first layer above the baseplate and the first tube using solid-state additive manufacturing techniques. The first layer completely covers the first tube, where the first tube is configured for carrying a fluid through the part.

One general aspect includes a method for manufacturing a showerhead part for a showerhead in a semiconductor manufacturing system. The showerhead part incorporates a faceplate. The method includes operations for drilling first holes on a faceplate made of a first material, the first holes having a first diameter. The method further includes cladding the first holes and the faceplate with a second material to cover faceplate surface and extrude fill the first holes with the second material. Further, the method includes an operation for drilling second holes concentric with the first holes resulting in a part with holes coated with the second material. The second holes have a second diameter that is smaller than the first diameter. Further, the showerhead is created utilizing the showerhead part, where gas is deliverable through the second holes of the baseplate.

BRIEF DESCRIPTION OF THE DRAWINGS

Various ones of the appended drawings merely illustrate example embodiments of the present disclosure and cannot be considered as limiting its scope.

FIG. 2 illustrates the process for creating holes in a showerhead with protective coating, according to some example embodiments.

FIG. 20 is a flowchart of a method for manufacturing a part with embedded features, used in semiconductor manufacturing equipment, utilizing solid-state additive manufacturing, according to some example embodiments.

DETAILED DESCRIPTION

Example methods, systems, and computer programs are directed to the making of parts, used in semiconductor manufacturing equipment, via solid-state additive manufacturing to create embedded features (e.g., embedded fluid channels) within the parts. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

Figure 1:
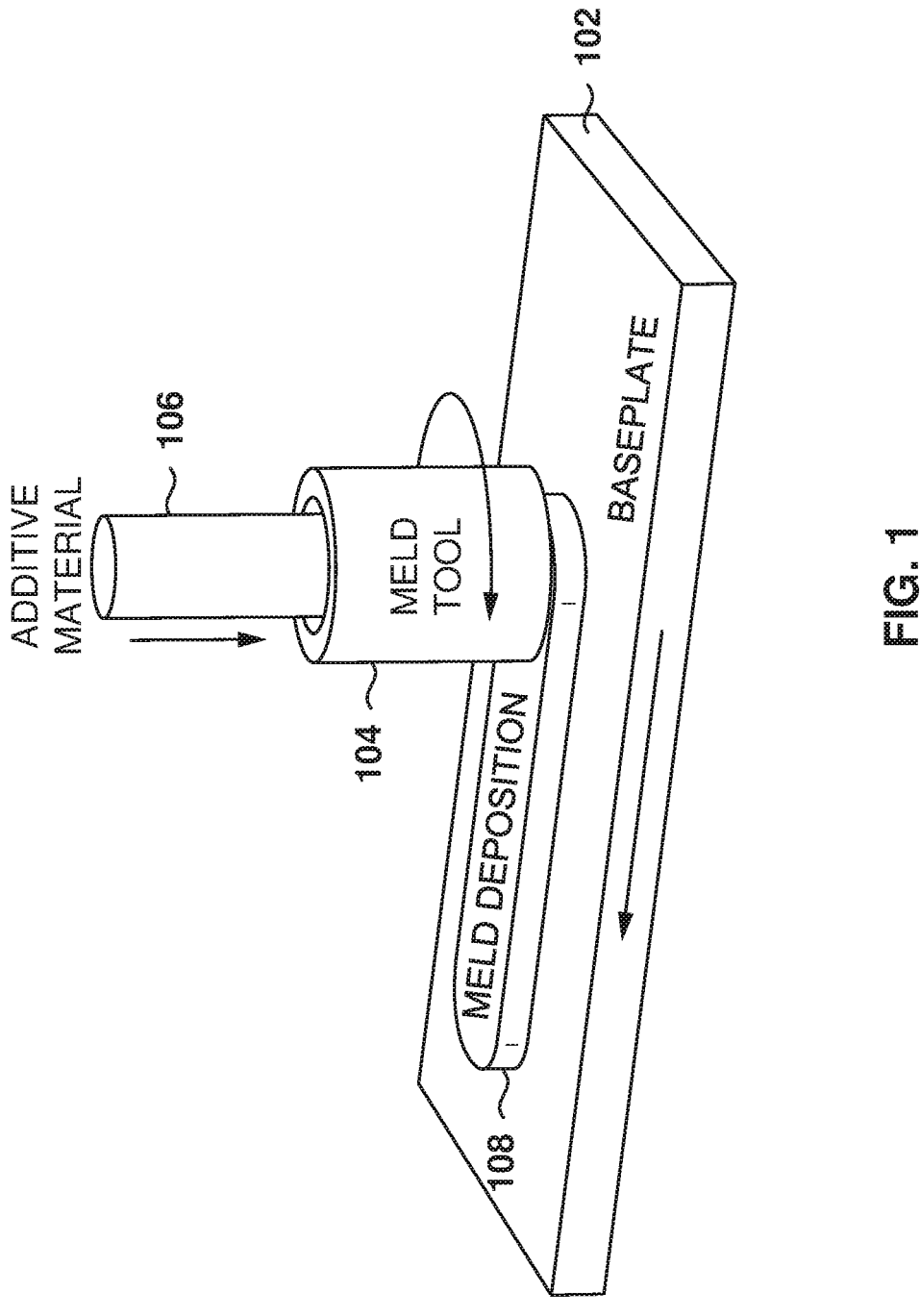
FIG. 1 illustrates the process for adding a layer of solid material using solid-state additive manufacturing, according to some example embodiments.

FIG. 1 illustrates the process for adding a layer of material using solid-state additive manufacturing, according to some example embodiments. Additive manufacturing (AM), also known as 3D printing, uses computer-aided design to build objects layer by layer. This contrasts with traditional manufacturing, which cuts, drills, and grinds away unwanted excess from a solid piece of material, often metal. This is the opposite of subtractive manufacturing methodologies that take away material from existing objects to create new objects. Synonyms for AM include additive fabrication, additive processes, additive techniques, additive layer manufacturing, layer-wise manufacturing, 3D printing and freeform fabrication.

MELD is a solid-state process for solid-state additive manufacturing, repairing, coating, and joining metals and metal matrix composites. A solid-state process means the material does not reach the melting temperature during the process. Further, MELD is basically an open-atmosphere process, rarely requiring environmental control such as special vacuums or gas shield, thereby making MELD scalable and able to make larger parts unlike other solid-state additive manufacturing processes. No melting means better mechanical and performance properties.

MELD is a type of severe plastic deformation (SPD), or just plastic deformation. Embodiments are presented herein with reference to MELD solid-state additive manufacturing, but other types of solid-state additive manufacturing or SPD processes may also be used for creating structures.

Friction stir welding (FSW) has been around for a number of years. FSW is a solid-state joining process that uses a non-consumable tool to join two facing workpieces without melting the workpiece material. Heat is generated by friction between the rotating tool and the workpiece material, which leads to a softened region near the FSW tool. While the tool is traversed along the joint line, the tool mechanically intermixes the two pieces of metal, and forges the hot and softened metal by mechanical pressure, which is applied by the tool, much like joining clay or dough. FSW is often used on wrought or extruded aluminum and particularly for structures that need very low joining defects.

MELD adds material to a base piece, referred to as baseplate, and is similar to FSW because there is no material melting. However, MELD deposits a layer of material on the baseplate to add an additional later.

As illustrated in FIG. 1, a MELD tool 104 spins while delivering additive material 106 to be deposited on the baseplate 102, creating a MELD deposition layer 108. The MELD tool 104 moves over the baseplate 102 to deposit additive material throughout the baseplate 102.

With MELD, the additive material 106 plasticizes (i.e., becomes "gummy" similar to chewing gum) as it is delivered by the head of the MELD tool 104 at the appropriate strain rate, or rotation rate, pressure and temperature. However, it should be noted that the additive material 106 does not reach the melting point.

As the MELD tool 104 moves over the baseplate 102, the MELD tool 104 applies pressure over the baseplate 102. The MELD deposition layer 108 may have a thickness between 500 μm and 2 mm, although other values may also be possible. The MELD deposition layer 108 does not have to be uniform over the baseplate 102, thereby allowing the possibility of creating patterns (e.g., spaces) on the layer created above the baseplate 102.

The additive material 106 may be of many different types, such as different types of aluminum and alloys, because the materials are not melted. Since the additive material 106 is not melted during the process, there is no residual stress that would otherwise occur with welding.

Solid-state additive manufacturing has multiple uses for creating semiconductor manufacturing equipment parts:

1. Cladding special materials on regular materials (e.g., showerheads and pedestals).

2. Embedding features inside parts, (e.g., top-plate heaters and/or coolers, gas delivery systems).

3. Making FGM materials with different properties in different sections of the part (e.g., baseplate with low coefficient of linear thermal expansion (CTE)).

4. Providing Fine Grained (FG) or Ultrafine Grained (UFG) materials. The UFGs have two advantages. First, the ability to produce materials with a tailored grain size. The UFG materials, under specific thermal or thermo-mechanical treatment, can increase to a tailored grain size very suitable to semiconductor process. Second, feed stock for a forming or super-forming process for formable, or even non-formable, metals and alloys; the FG/UFG materials are essentially superplastic under specific strain, strain rate, and temperature. For example, the MELD processed materials can be used for forming process for liners, cartridge cups, etc.

The advantages of using solid-state additive manufacturing include:

1. 100% contact of heater/cooler with plates, which means higher efficiency.

2. Cover "bad" materials that may be sensitive to the process (e.g., exposure to plasma) with better materials that are not sensitive, or are much less sensitive, to the process.

3. Control metallurgical functionality layer-by-layer (e.g., creating parts with embedded channels).

FIG. 2 illustrates the process for creating holes in a showerhead 214 with protective coating, according to some example embodiments. If a faceplate has holes embedded and solid-state additive manufacturing is applied over the holes, the holes may be filled, to a certain depth, with the additive material. The plasticized material applied by the MELD tool's head enters the hole and fills the hole. This process is effectively the same as cladding. The additive material may be different than the material of the baseplate 102 and additive material may be selected to fulfill a desired property of the final part, such as protection from plasma or avoiding contamination in the chamber.

The showerhead 214 is a part used to deliver gas into a semiconductor manufacturing chamber. Typically, the showerhead 214 is aluminum 6061 and the showerhead 214 includes a plurality of holes for letting the gas pass through.

The problem with aluminum 6061 is that it has minute amounts of iron silicon and copper, which may cause contamination in the plasma chamber. Mg may also result in outgassing under process condition as well. Additionally, there might be welding on some parts of the showerhead 214 and the welding material may also be a source of contamination or expedite corrosion related failures.

There are other materials that would be better for the showerhead 214, such as an aluminum alloy or pure aluminum 1000 series. In some example embodiments, the aluminum alloy is a binary aluminum alloy having at least 99 mass percentage content of aluminum, 0.5%-1.0% mass percentage content of Magnesium (Mg), and very low impurities (e.g., maximum 0.06% mass of silicon and maximum 0.06% mass of copper). In other example embodiments, the aluminum alloy may include other mass percentage of aluminum content, such as in the range from 50% to 99.9%. However, these are expensive materials for making the complete showerhead 214.

A solution is to use aluminum 6061 as the baseplate 102 and cover the surface of the showerhead 214 exposed to the plasma, and the holes in the showerhead 214, with a better material that has more longevity and avoids contamination of the process by covering the iron and silicon with the aluminum 6061.

To make a showerhead 214 surface that is exposed to plasma, the process begins with the baseplate 102. At operation 202, holes are mechanically drilled into the baseplate 102 to obtain part 204. The holes that are drilled are bigger than the final size of the holes in the showerhead 214 to allow space for the protective material within the holes.

At operation 206, the part 204 is cladded with a different material, such as aluminum 3003, to fill the holes and add a layer of the different material and obtain part 208. In some example embodiments, the added layer has a thickness between 500 μm and 4 mm, although other values may also be possible. Because cladding through solid state AM is done using high pressure, the additive material is plasticized and flows freely and can be pushed into the holes. In some embodiments, the holes may be 3 mm high and cladding is able to fill the complete depth of the holes.

At operation 210, holes are drilled into part 208, but the holes are smaller than the holes made in operation 202. The result is faceplate 212 that has a protective layer and holes that are also covered with the different material. The faceplate 212, faced down, is then used as the surface of the showerhead 214 that can be exposed to plasma.

In some example embodiments, the first holes are eighty thousandths of millimeter and the second holes are forty thousandths of millimeter, resulting in a thickness of the second material coating of twenty thousandths of millimeter. In some example embodiments, the first holes have a diameter in a range from sixty thousandths of millimeter to three millimeter, and the second holes have a diameter in a range from forty thousandths of millimeter to 0.5 millimeter, with a difference between the diameters of the holes of at least ten thousandths of millimeter. In one example the coating of the surface of the holes of the second material is in the range of 50 μm to 2 mm.

The showerhead 214 then has a structure of stronger, cheaper aluminum 6061 but the process advantage of superior aluminum alloys that is exposed to the elements in the chamber. For instance, the base material can be cladded with a binary aluminum alloy having at least 99 mass percentage content of aluminum, 0.5%-1.0% mass percentage content of Magnesium (Mg).

For example, in deposition operations, nickel plating is a good way to protect parts. However, nickel plating comes with many problems and complex processes. By using solid-state additive manufacturing techniques with nickel, the problems with nickel plating go away and making parts coated with nickel is a much simpler process. Further, tantalum is also very difficult to machine, but tantalum may also be used with solid-state additive manufacturing.

Further, aluminum 6061 is used in many parts because it is cheaper and commercially available than the majority of other wrought aluminum alloys, but it is not the best material possible for semiconductor tool manufacturing. There are also better camber materials such as Hastelloy® C22 (an austenitic nickel-chromium-molybdenum-tungsten alloy) with proven performance in aggressive environment; however, they are very expensive and not easy to manufacture through conventional manufacturing. With solid-state additive manufacturing, it is possible to use a substrate of inexpensive materials such as 316/316L and clad it with Hastelloy C22. Also, different types of materials may be used as the showerhead faceplate to further lower manufacturing cost or enhanced performance.

It is noted that cladding may be done in 3D thanks to solid-state additive manufacturing, as the head can move on three axes and print over multiple surfaces that do not have to be perfectly flat and horizontally placed. Also, the parts may be moved by a robotic arm to create cladding in almost any possible 3D direction and structure. Thus, in some example embodiments, the faceplate 212 may have a curvature instead of being flat.

The same principles may be used with cladding materials for making a pedestal that holds the substrate. The pedestal includes a heater for heating the substrate. Some pedestals are made of aluminum 3003, but there is a limit of how high the temperature can go for the pedestal before aluminum 3003 starts to creep.

In some example embodiments, a pedestal is made with the base of aluminum 6061, which is a strong material, and the aluminum 6061 is covered with a softer material, such as an aluminum alloy or pure aluminum. This way, it is possible for the pedestal to be heated to higher temperatures.

Figure 3A:
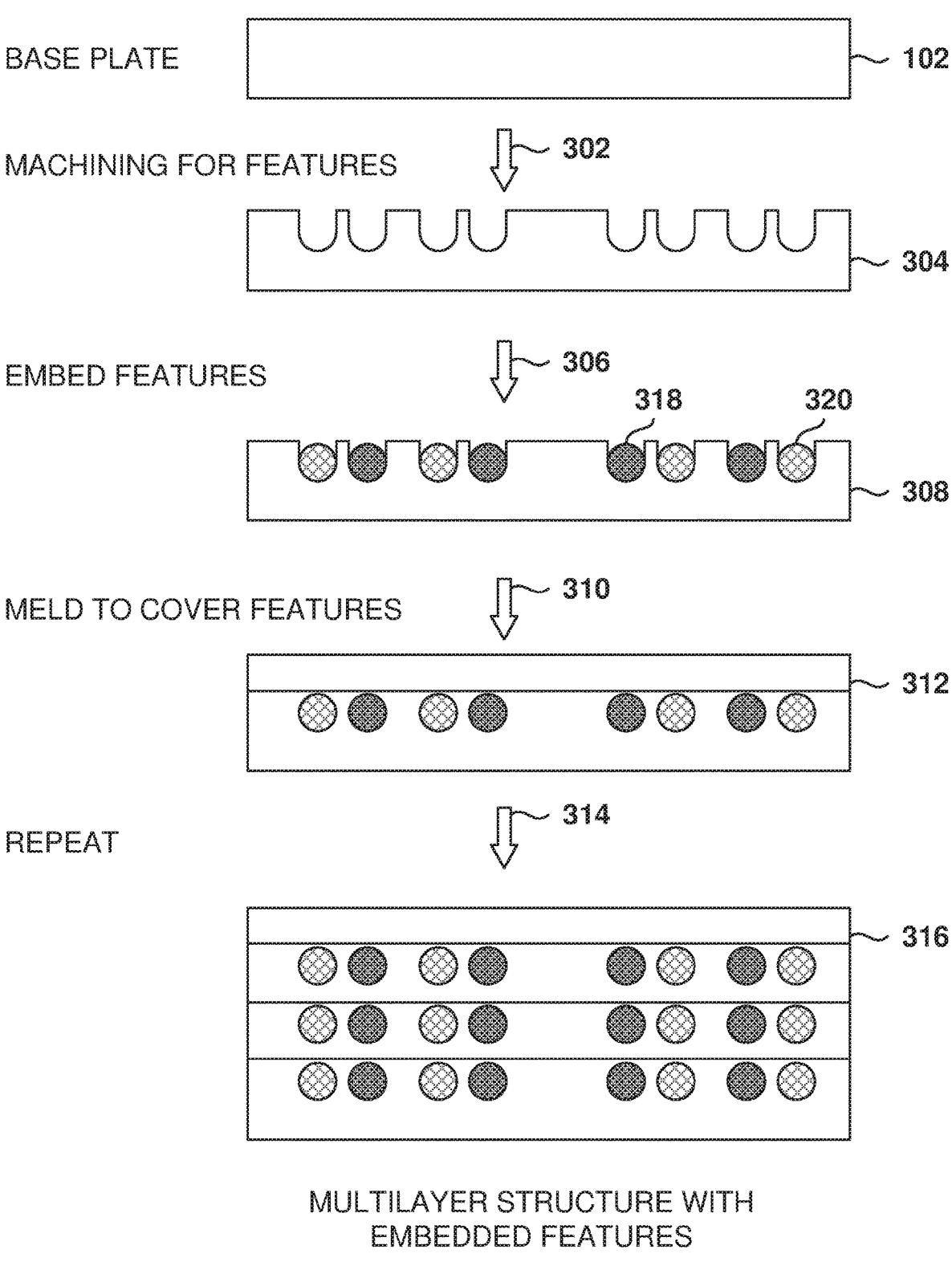
FIG. 3A illustrates the process for creating multilayer structures with embedded features, according to some example embodiments.

FIG. 3A illustrates the process for creating multilayer structures with embedded features, according to some example embodiments. In some example embodiments, the embedded features include channels for transporting fluids for cooling or heating. Multiple features with different characteristics may be embedded simultaneously in the same part.

In the example illustrated in FIG. 3A, a part 316 is created with embedded heating elements 318 and cooling elements 320 disposed on multiple layers.

At operation 302, machining is performed on the baseplate 102 to generate grooves to hold the embedded features, resulting in part 304.

At operation 306, the features (heating elements 318 and cooling elements 320) are placed (e.g., embedded) on the part 304 to obtain part 308. The features may include tubes for carrying fluids.

At operation 310, solid-state additive manufacturing is performed over part 308 to cover the embedded features, resulting in part 312. The process may be repeated 314 several times to obtain several layers of embedded features. In the example illustrated in FIG. 3A, three layers of embedded features are created to create the part 316, but other embodiments may have fewer or additional layers of embedded features. Further, the embedded features do not have to be the same in each of the layers. For example, one layer may be used for cooling elements and another layer may be used for heating elements, or the order of features in each layer may be changed, such as by alternating elements, which may create checkerboard pattern.

Figure 3B:
FIG. 3B shows examples of features imbedded at different depths.

FIG. 3B shows examples of features imbedded at different depths. The features can be imbedded at different depths. For example, the feature may be embedded such that the bottom of the feature is at a distance from the surface that is twice the height of the feature (or more), the feature may be exposed and only partially imbedded within the baseplate, or any distance in between.

Figure 4:
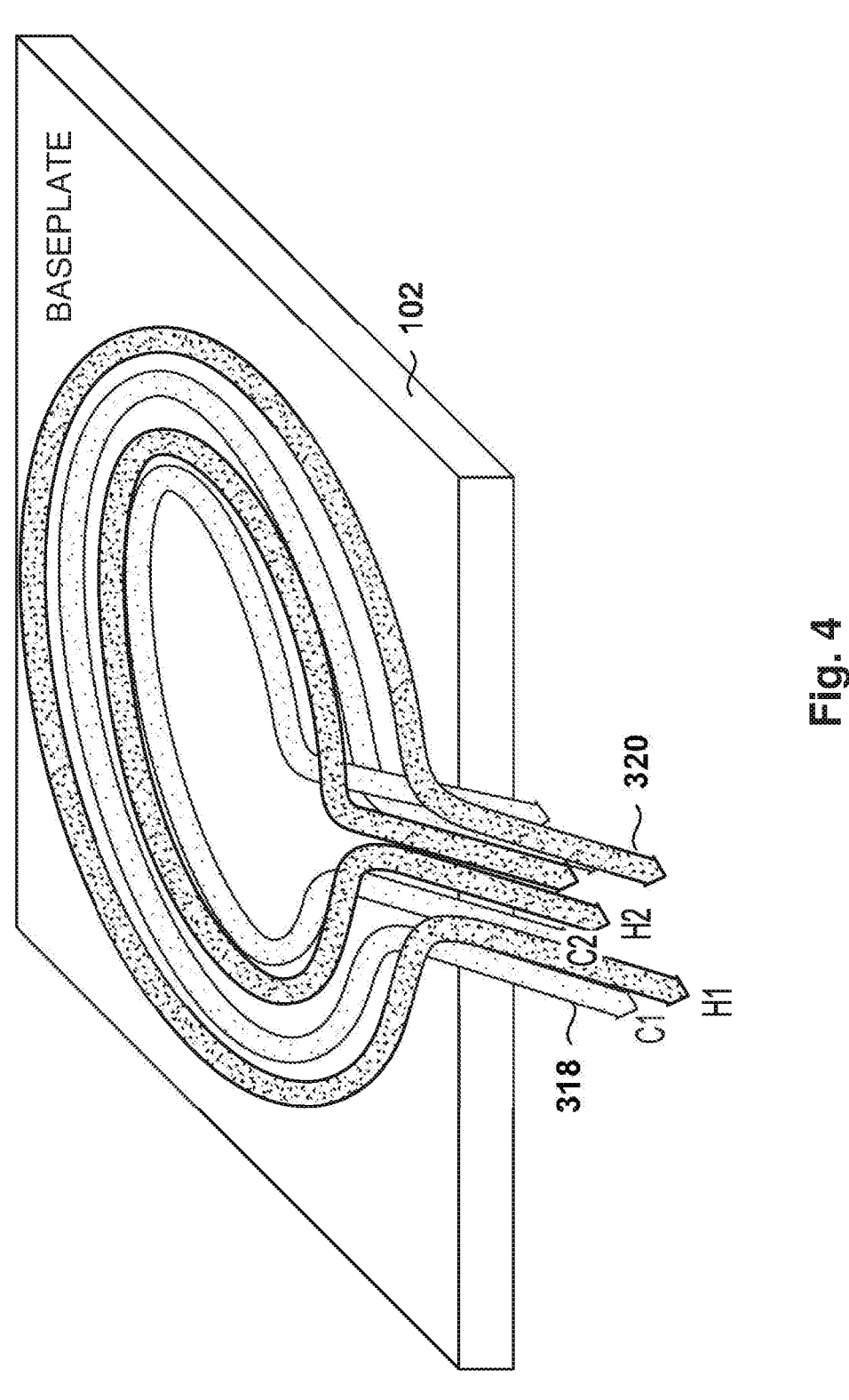
FIG. 4 shows the creation of a part with embedded channels for heating and cooling, according to some example embodiments.

FIG. 4 shows the creation of a part with embedded channels for heating and cooling, according to some example embodiments. FIG. 4 shows a perspective view of the baseplate 102 with the embedded heating elements 318 and cooling elements 320.

The embedded heating elements 318 and cooling elements 320 circle around above the baseplate 102, where a fluid may enter on one end and exit out the other end.

Figure 5:
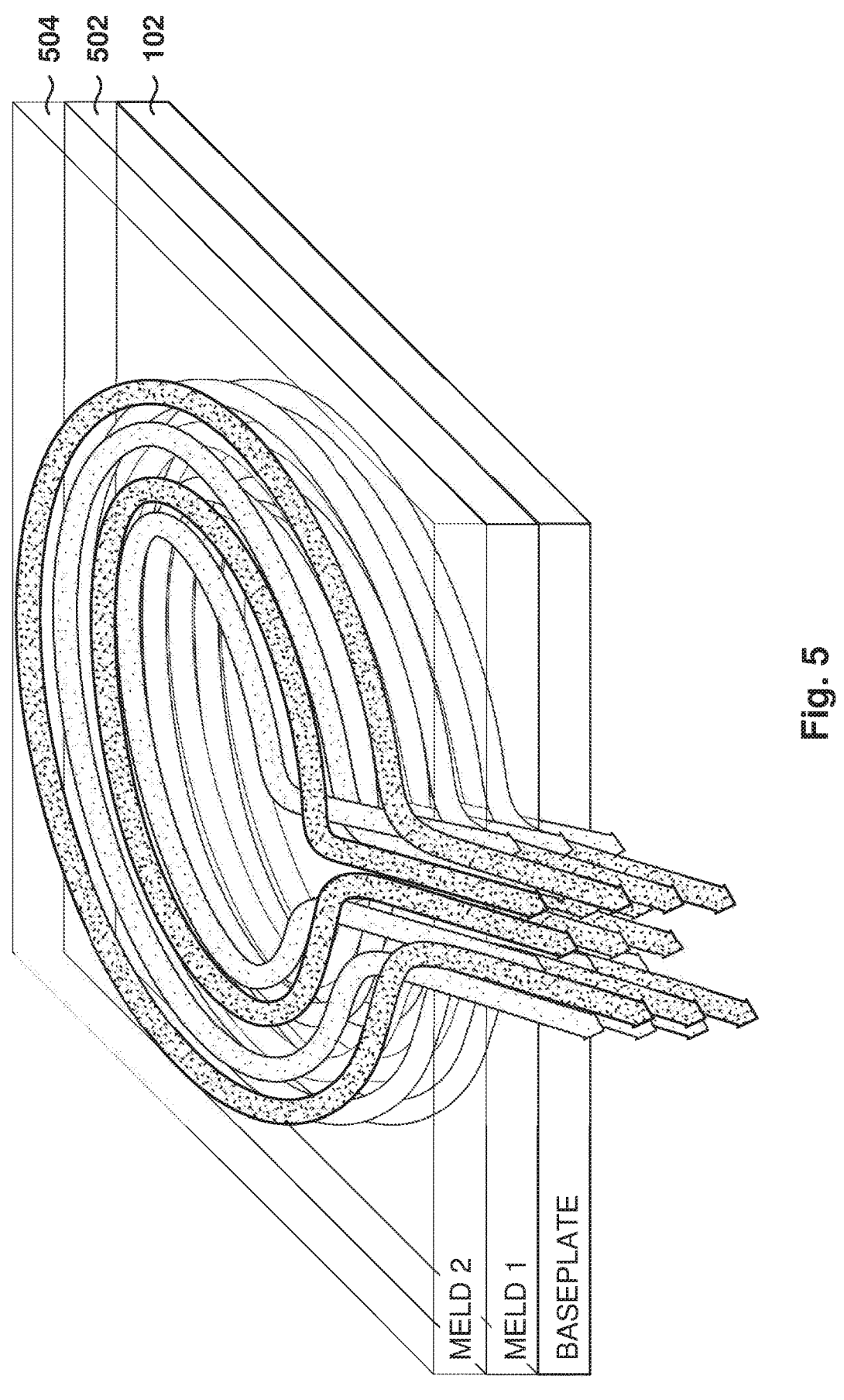
FIG. 5 shows a part with multiple layers and different cooling and heating channels, according to some example embodiments.

FIG. 5 shows a part with multiple layers and different cooling and heating channels, according to some example embodiments. After adding the embedded channels, cladding is applied to cover the embedded channels. Further, the process repeats to add additional embedded channels and different layers.

In the example illustrated in FIG. 5, two layers 502 and 504 are added above the baseplate 102, and embedded channels are included between each of the layers to provide through coverage of the part for heating or cooling.

Figure 6:
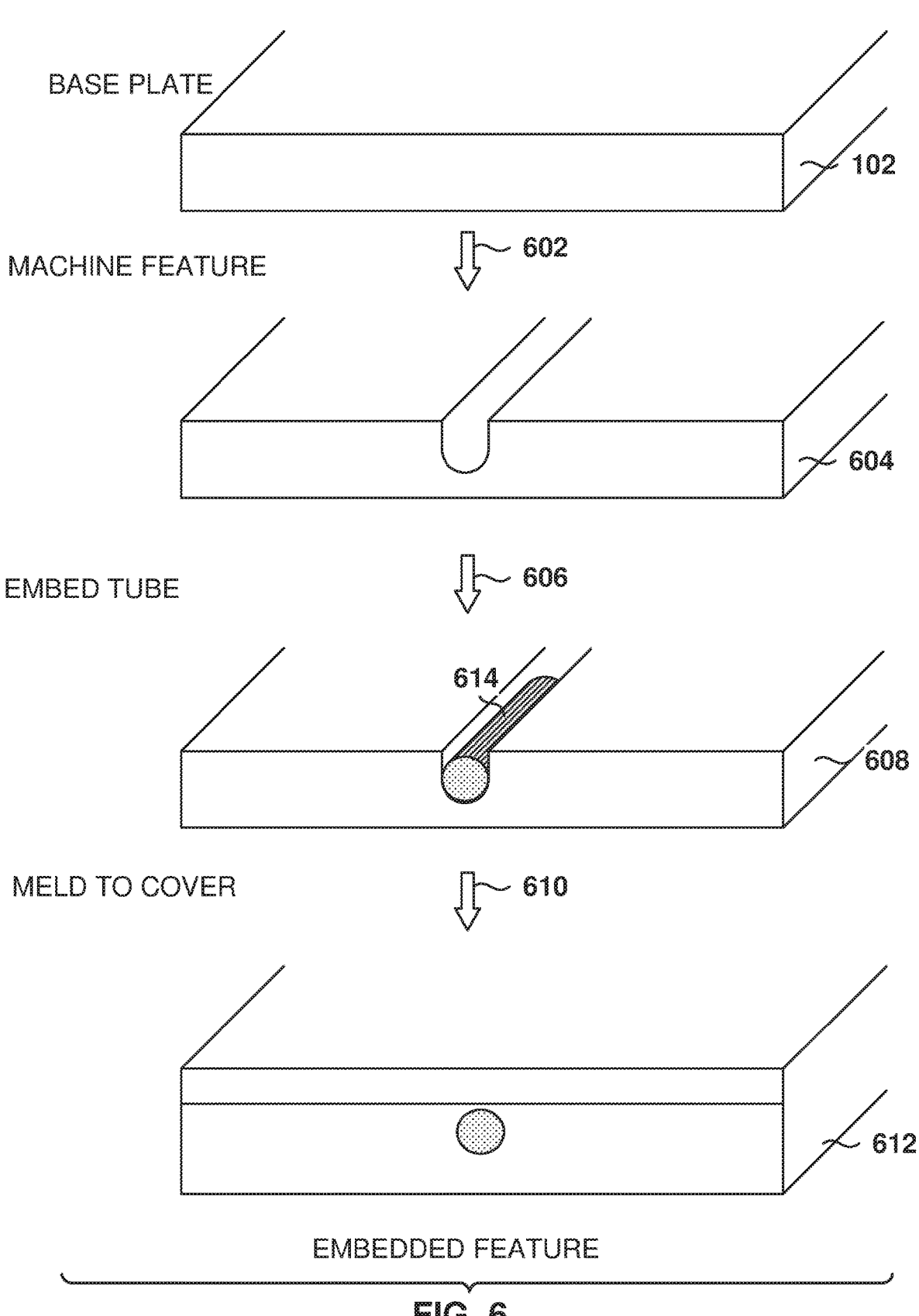
FIG. 6 illustrates the process of embedding a tube within a multilayer part, according to some example embodiments.

FIG. 6 illustrates the process of embedding a tube within a multilayer part, according to some example embodiments. FIG. 6 shows a perspective view of the manufacturing process. The baseplate 102 is machined at operation 602 to make a groove, resulting in part 604. At operation 606, tube 614 is placed on the groove to make part 608. In some example embodiments, tube 614 is made of copper, but other materials may be used.

A MELD process is used at operation 610 to cover part 608 with another layer of material, resulting in part 612 with the embedded tube 614.

In some example embodiments, the tube 614 may be used during the making of the part 612. The tube 614 is made of a disposable material and the tube 614 is removed afterwards (e.g., by dissolving the material), thereby leaving part 612 with an embedded hollow channel. For example, boiler-type plastic may be used and after the solid-state additive manufacturing is done, the part is placed in a furnace and the plastic evaporates as carbon dioxide. Another example is using sacrificial materials to fill the channels and MELD could move over the incompressible materials such as many water dissolvable salts. After the MELD process, the salts will be dissolved by submerging the part into water or final cleaning.

One of the disadvantages of the welding process is that the contact between the tube 614 (e.g., copper tube) and the baseplate 102 is limited; that is, there is no complete contact. However, solid-state additive manufacturing exerts a high amount of pressure accompanied by flow of materials that will make the contact greater up to full contact, there is also metallurgical bonding that further increases the amount of contact to be close to one hundred percent contact. Further, processing embedded features with solid-state additive manufacturing avoids use of epoxy for full contact, and it resolves the issue of loss of contact by losing epoxy or crack in the epoxy as a result of thermal cycles. With current manufacturing processes, the contact may be around 10%, but with solid-state additive manufacturing, the contact may be 90% to 100%.

Since solid-state additive manufacturing, or friction stir welding, exerts a high amount of pressure on tube 614, the tube 614 may deform if the tube 614 has thin walls or is made of weak material. In order to strengthen the tube 614 during the solid-state additive manufacturing, the tube 614 is filled with a liquid to give it strength. After the solid-state additive manufacturing, the liquid is taken out.

When the tube 614 has quasi hydrostatic pressure, which means that there is pressure everywhere, there is no way to collapse the tube 614 or break it.

Figure 7:
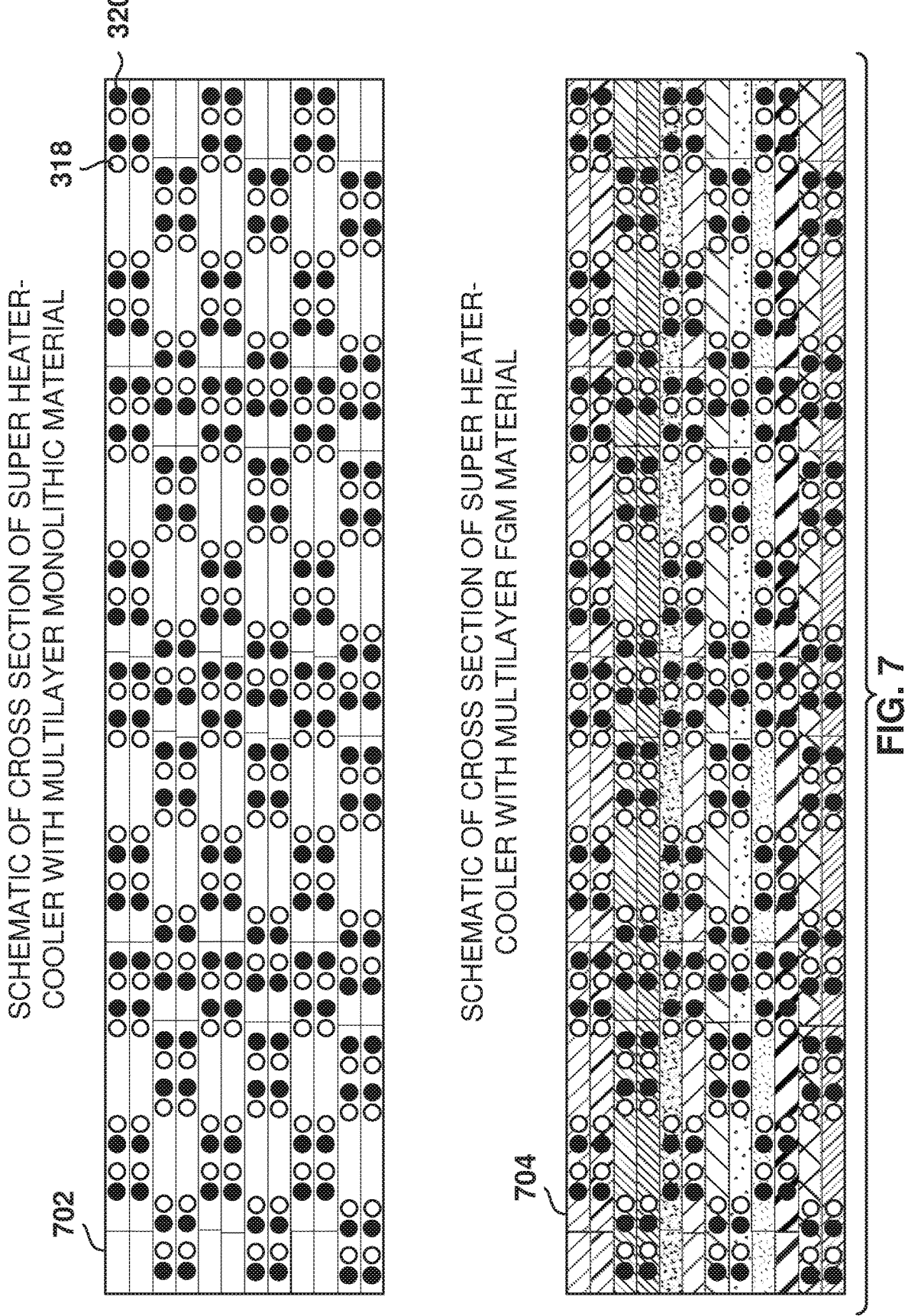
FIG. 7 illustrates the process for creating multiple layers, that include different materials, with embedded features, according to some example embodiments.

FIG. 7 illustrates the process for creating multiple layers, that include different materials, with embedded features, according to some example embodiments. Part 702 includes a variety of layers with embedded features, including heating elements 318 and cooling elements 320.

By controlling the placement of the heating elements 318 and the cooling elements 320, it is possible to better control the temperature distribution of the part 702 during operation of the chamber.

Part 704 also includes multiple layers of embedded features but, unlike part 702, the different layers have different types of materials, so the whole part 704 is not made of the same element. This way, it is possible to control not only heating and cooling but also the properties of surfaces in the part 704. For example, a surface that is exposed to plasma may be built with a more expensive material that will not cause pollution on the chamber.

Figure 8:
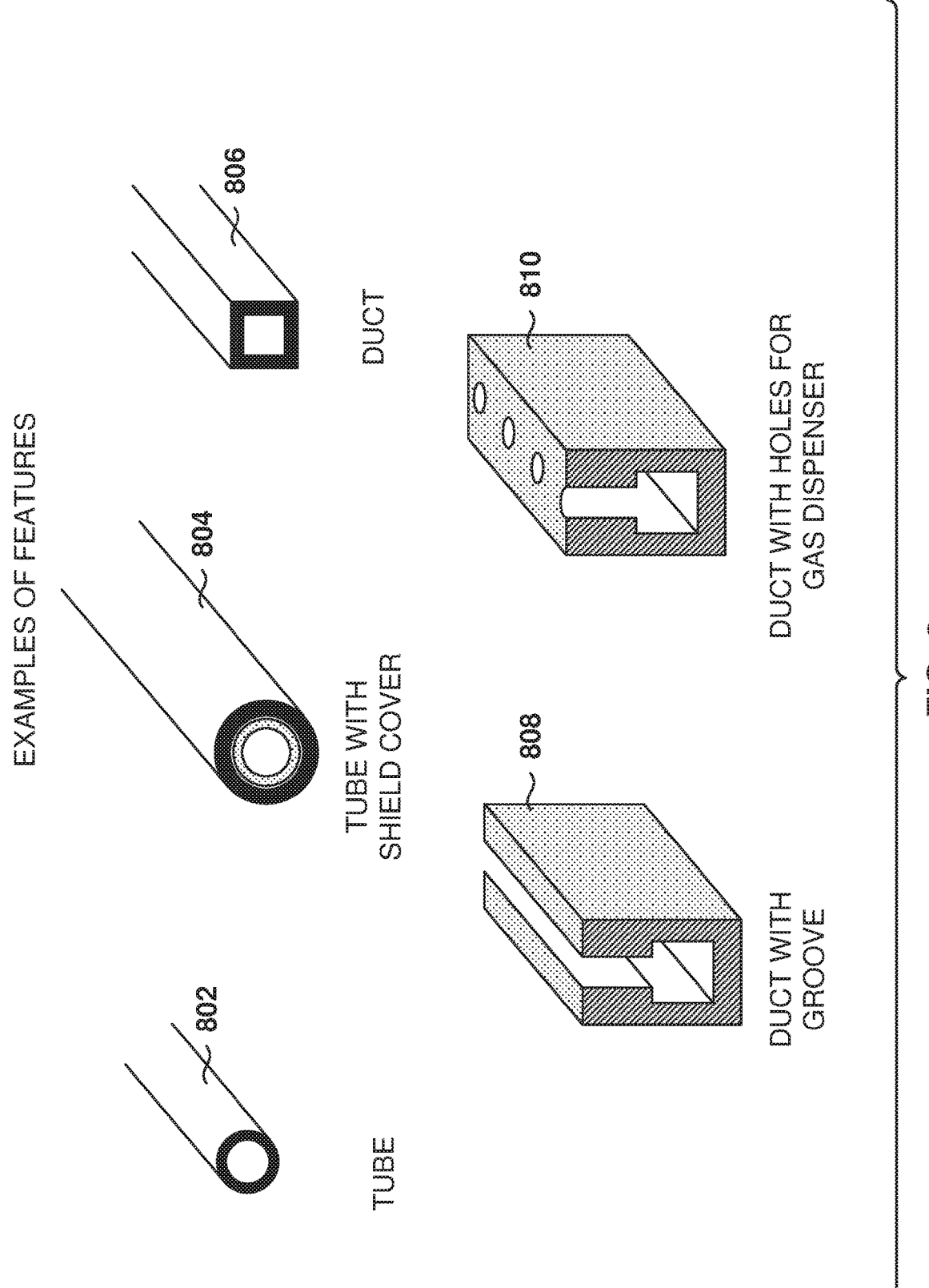
FIG. 8 shows some examples of embedded features.

FIG. 8 shows some examples of embedded features. Some of the features that may be embedded include a tube 802 and a tube 804 with shield cover; that is, tube 804 includes a tube of two materials, one on the inside and one on the outside.

Further, the examples of embedded features include a duct 806 with a square cross-section, and a duct 808 with a cross-section that includes a square and a connected rectangle above the square to form a groove. The channel may be used to deliver a fluid via the groove on the top.

Further, the example embedded features include a duct 810 with a similar cross-section to duct 808, except that instead of a continuous groove at the top, holes are made to connect to the bottom square channel. The number and size of the holes may be controlled to regulate the flow of fluids.

Figure 9:
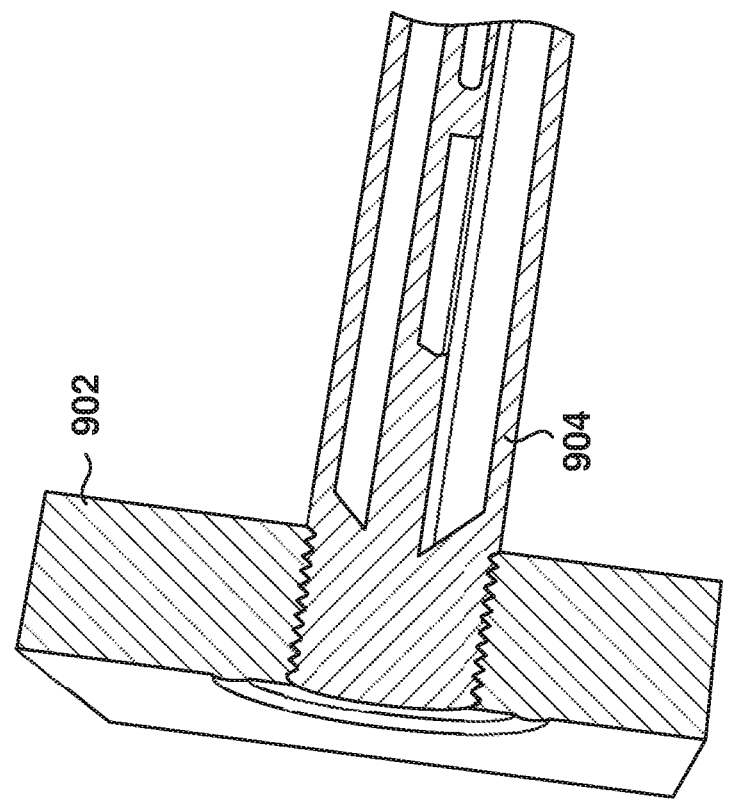
FIG. 9 shows a sectional view of two pieces joined through friction stir welding, according to some example embodiments.

FIG. 9 shows a sectional view of two pieces joined through friction stir welding, according to some example embodiments. Part 902 is aluminum 6061 and part 904 is aluminum silicon. Initially, part 904 is threaded into part 902. However, the contact is not perfect. Therefore, friction stir welding is utilized to clad both parts together.

FIG. 9 illustrates how the pieces meld together towards the top, where the friction stir welding takes place, but the welding only goes about half the distance of the thread, such that the bottom of the thread shows a small amount of stir welding.

At the surface where the welding takes place, there is a slight amount of mixing of the two materials due to the stirring of plasticized materials that takes place.

Since there may be some mixing of materials, the design must take this mixing into consideration. For example, in the case of the showerhead illustrated in FIG. 2, the coating on the holes has to be big enough to avoid exposure of the mixed part on the surface after the drilling of the holes is performed the second time.

To avoid exposure of the mixed part on the surface, after the drilling of the holes is performed the second time, the first holes are drilled larger than the diameter of the second holes. This way, the contact area where the two materials meet is not exposed after drilling the second holes. For example, the first holes are eighty thousandths of millimeter and the second holes are forty thousandths of millimeter.

Figure 10:
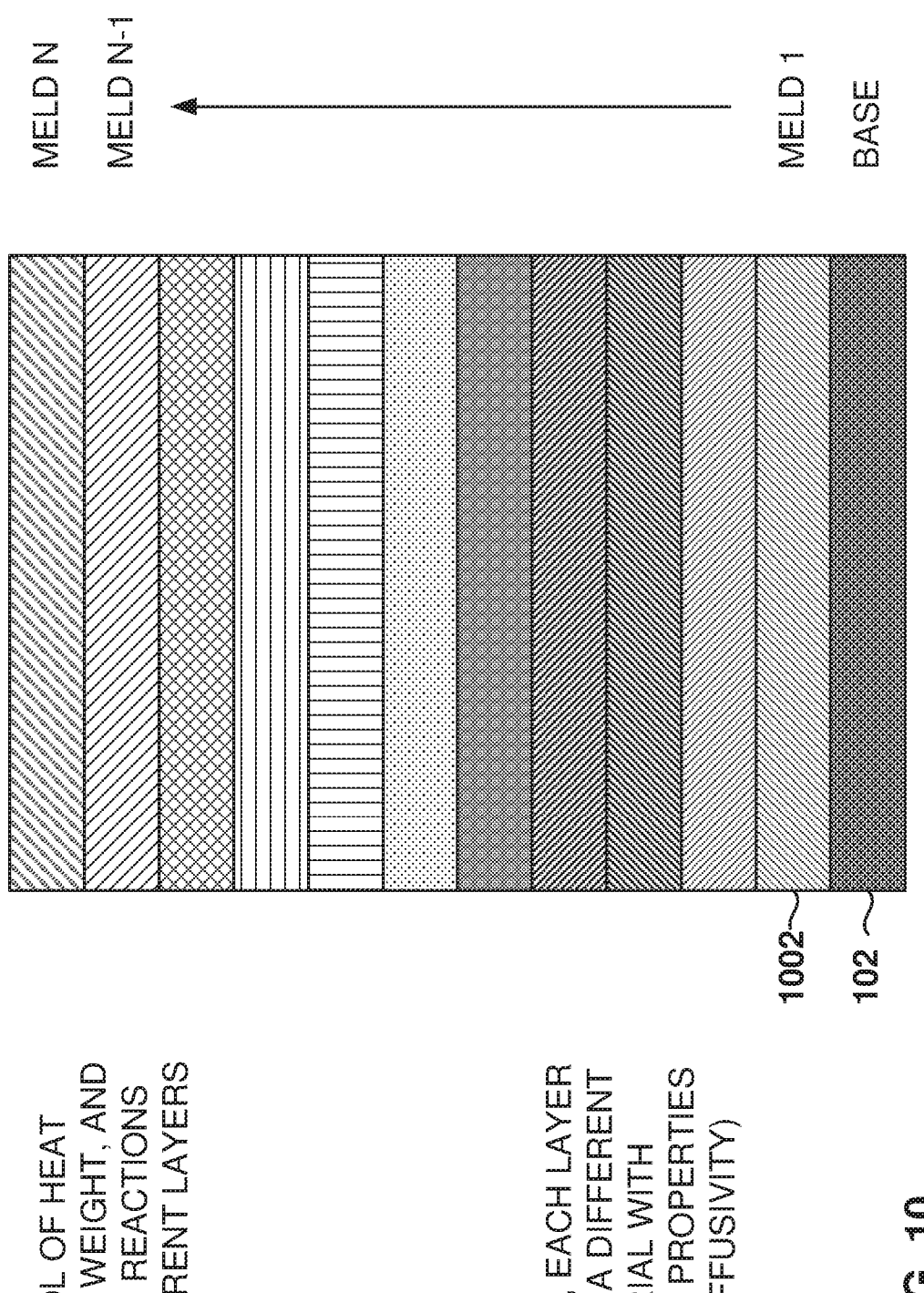
FIG. 10 shows the creation of multiple layers through melding, according to some example embodiments.

FIG. 10 shows the creation of multiple layers through melding, according to some example embodiments. FGM allows parts composed of multiple layers. The selection of layers is designed to control the properties of the FGM part, such as strength, heat transfer, weight, and chemical reactions of the different layers.

With FGM, layers are added one at a time, starting with the baseplate 102 and then adding additional layers 1002 through solid-state additive manufacturing. Each of the layers may have a different material with different properties (e.g., electrical or heat conductivity and diffusivity).

For example, if the top layer is designed to be in contact with the plasma chamber or in contact with some chemicals, the top layer may be formed of a high-performance material that behaves well when exposed to a plasma chamber or some chemicals. However, other materials may be formed with less expensive materials if the materials will not be in contact with the plasma chamber. Further, not all the layers have to be made of different materials; the same material may be used on several layers.

For example, several bottom layers may be formed with aluminum 6061 that is strong and cheaper than aluminum low zinc 3003. The top two layers may be formed with aluminum low zinc 3003 that has less impurities, so the impurities will not contaminate the chamber during operation.

Many types of materials may be used as the baseplate 102 and for cladding with solid-state additive manufacturing process. Some of the base materials include rolled aluminum 6061, cast aluminum 356, cast aluminum 357, and stainless steel 316L or 304.

Some example materials for solid-state additive manufacturing or cladding include aluminum alloy, aluminum low zinc 3003, aluminum 1050, nickel, Inconel 625, Inconel 718, Haynes C22, tantalum, cadmium, and pure aluminum.

With FGM, new possibilities are open to create new parts coated with materials that would have been too expensive to use in the past, such as platinum or an aluminum alloy having at least 99 mass percentage content of aluminum and a small content of magnesium. Further, some of these materials are not machinable and cannot be cast so the use of solid-state additive manufacturing enables the use of these materials.

Figure 11:
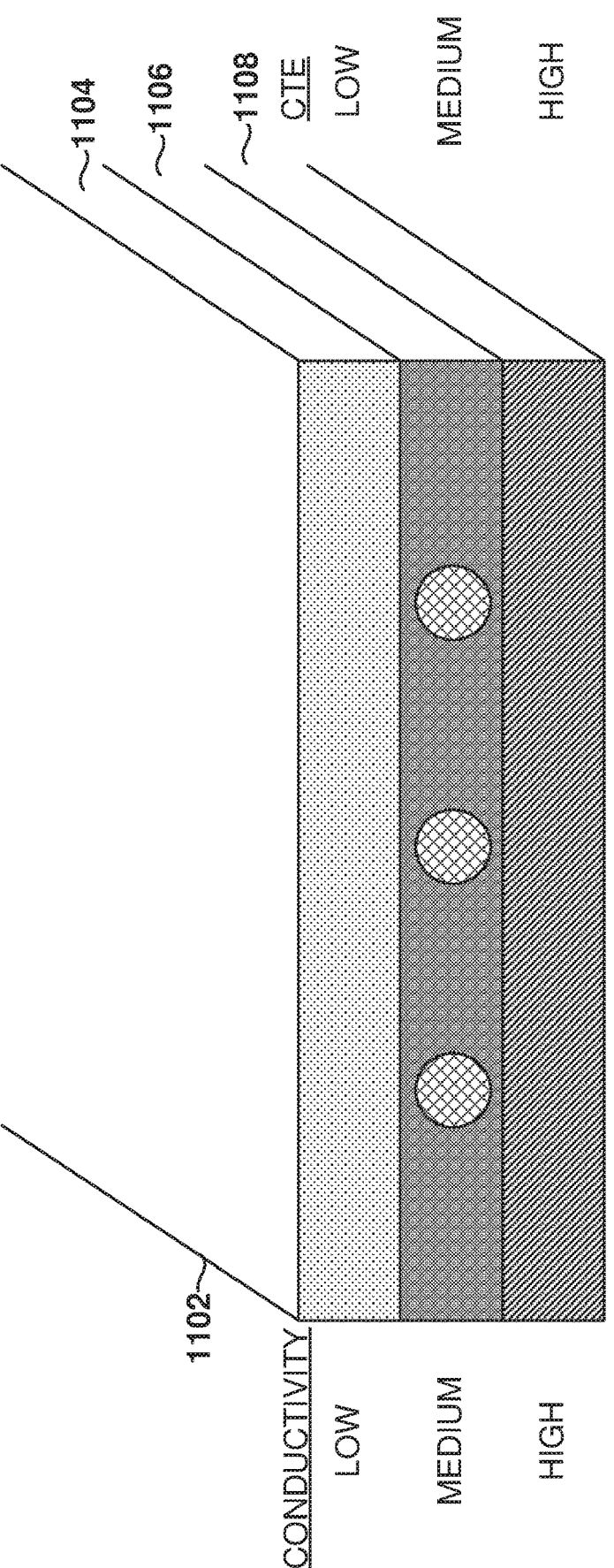
FIG. 11 shows a part with embedded channels and three layers of different characteristics, according to some example embodiments.

FIG. 11 shows a part with embedded channels and three layers of different characteristics, according to some example embodiments. Pedestals have electrical heaters inside to heat the substrate, and vapor from the chamber may become in contact with the pedestals. As discussed above, some pedestals are made of aluminum 3003, which is an aluminum alloy with a diluted amount of manganese and silicon. However, aluminum 3003 cannot support a very high operating temperature.

Another problem with aluminum 3003 pedestals is expedited fluorination that may cause the pedestal to start flaking. Flaking may be due to fluorination, where a radical of fluorine reacts with the aluminum or the aluminum alloys.

When the pedestal flakes, the pedestal can create powder material (aluminum fluoride) that becomes vapor, and the particles in the vapor will contaminate the manufacturing chamber.

To avoid the problems of aluminum 3003, pedestals may be made of other materials, such as aluminum alloys. However, machinability is very low for the aluminum alloys and the aluminum allows are also expensive (e.g., 5 to 7 times the cost of aluminum 3003).

One solution for creating a durable pedestal is to start with a stronger, cheaper material, such as aluminum 6061, and then clad one layer of material that is better for chemical contact in the chamber, such as pure aluminum or aluminum alloys. This way, the pedestal has chemical resistance and strong structural integrity. Further, the layers do not have to have the same size, and a small layer of pure aluminum or aluminum alloy might be built on top of a thicker aluminum 6061 baseplate.

The layers may be of different materials. In some example embodiments, the head may supply two different materials simultaneously, such as aluminum and aluminum fluoride. The head includes two feeders, one for powder A and one for powder B. The materials may then be combined, for example a ceramic and a metal to process at the same time. In some example embodiments, a binder may also be added to the process, such as to bind aluminum fluoride. This way, different alloys or composite compounds may be created during the layer wise cladding process that may not easily be available commercially.

Some baseplates are made with a metal base that has an embedded cooling channel and a ceramic coating on top. Over time, because of the difference in CTE between the baseplate and the coating, the baseplate plate cracks. Therefore, the longevity of the baseplate is a concern.

Parts may be designed with layers that have different conductivity and different CTE. In some example embodiments, one or more layers with different CTEs are interposed between the metal-based and the ceramic top. The CTE difference between the layers may be regulated to avoid cracking. In some example embodiments, the goal is to increase the conductivity at the bottom in order to divert the heat away from the top.

A pedestal 1102 is constructed with a baseplate 1108 with high CTE (and high conductivity), adding an intermediate layer 1106 with a medium CTE and a top layer 1104 with the low CTE. This way the CTE transition between bottom and top is not as substantial.

Further, additional layers may be intermixed with different levels of CTE to make the transitions of CTE values even smoother. Different features may be included in between, as discussed above, such as channels for conducting fluids.

Figure 12:
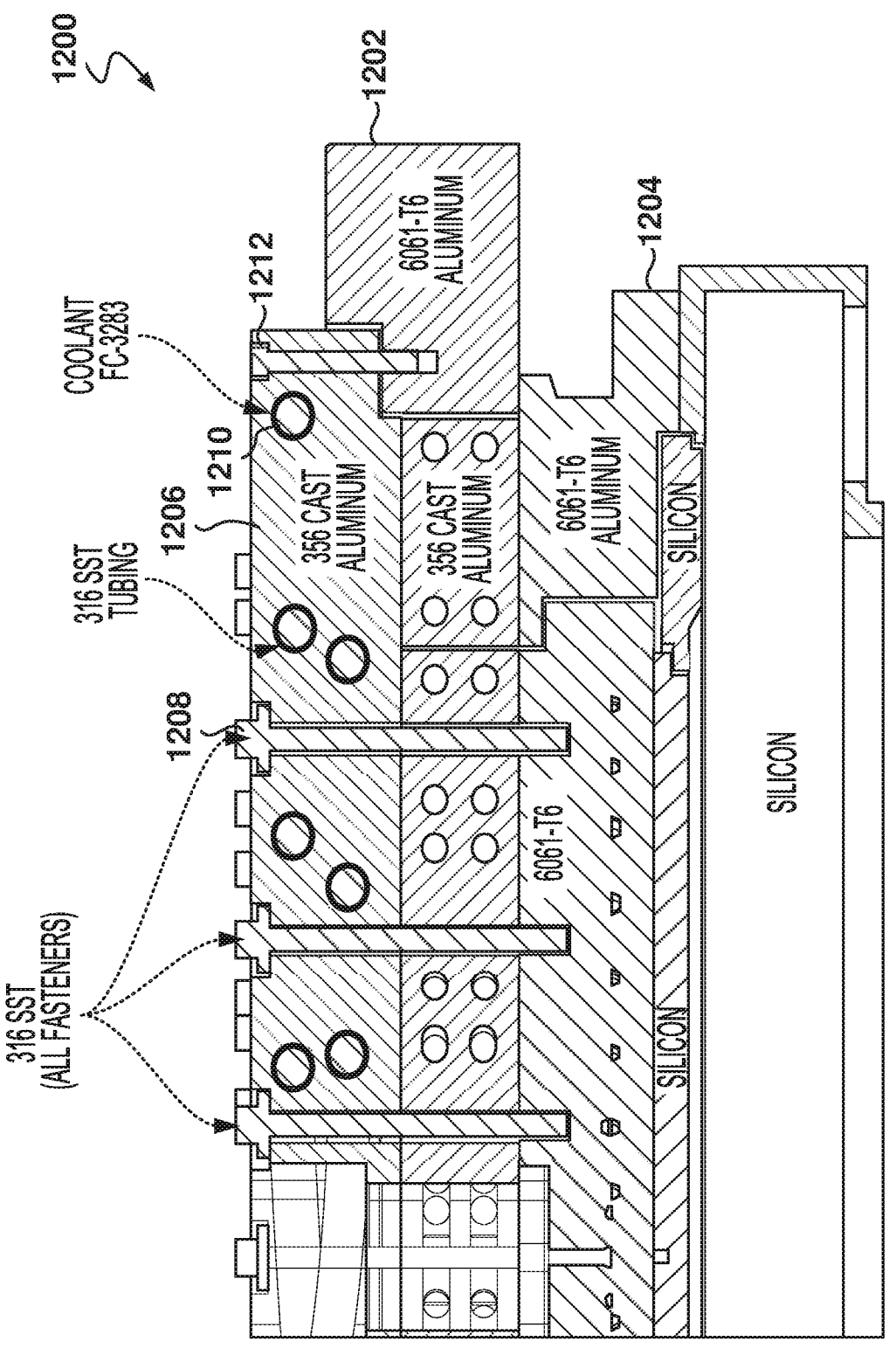
FIG. 12 illustrates the top plate of a semiconductor manufacturing equipment, according to some example embodiments.

FIG. 12 illustrates the top plate 1200 of a semiconductor manufacturing equipment, according to some example embodiments. The top plate 1200 has cast pieces with cooling and heating channels inside. Some of these parts 1202, 1206 are made aluminum 356, which is not desirable for the process because it contains silicon. Other parts (e.g., 1204, 1208, 1212) are made of aluminum 6061. Because manufacturing these parts involves casting, problems arise with cracking.

With casting, it is very difficult (or impossible for some designs) to embed a cooler and a heater in the same part. Because of this, some parts with coolers and some parts with heaters are manufactured and then the parts are assembled to create the top plate 1200. In this example, a top layer is made for cooling and the layer below is made for heating.

Figure 13:
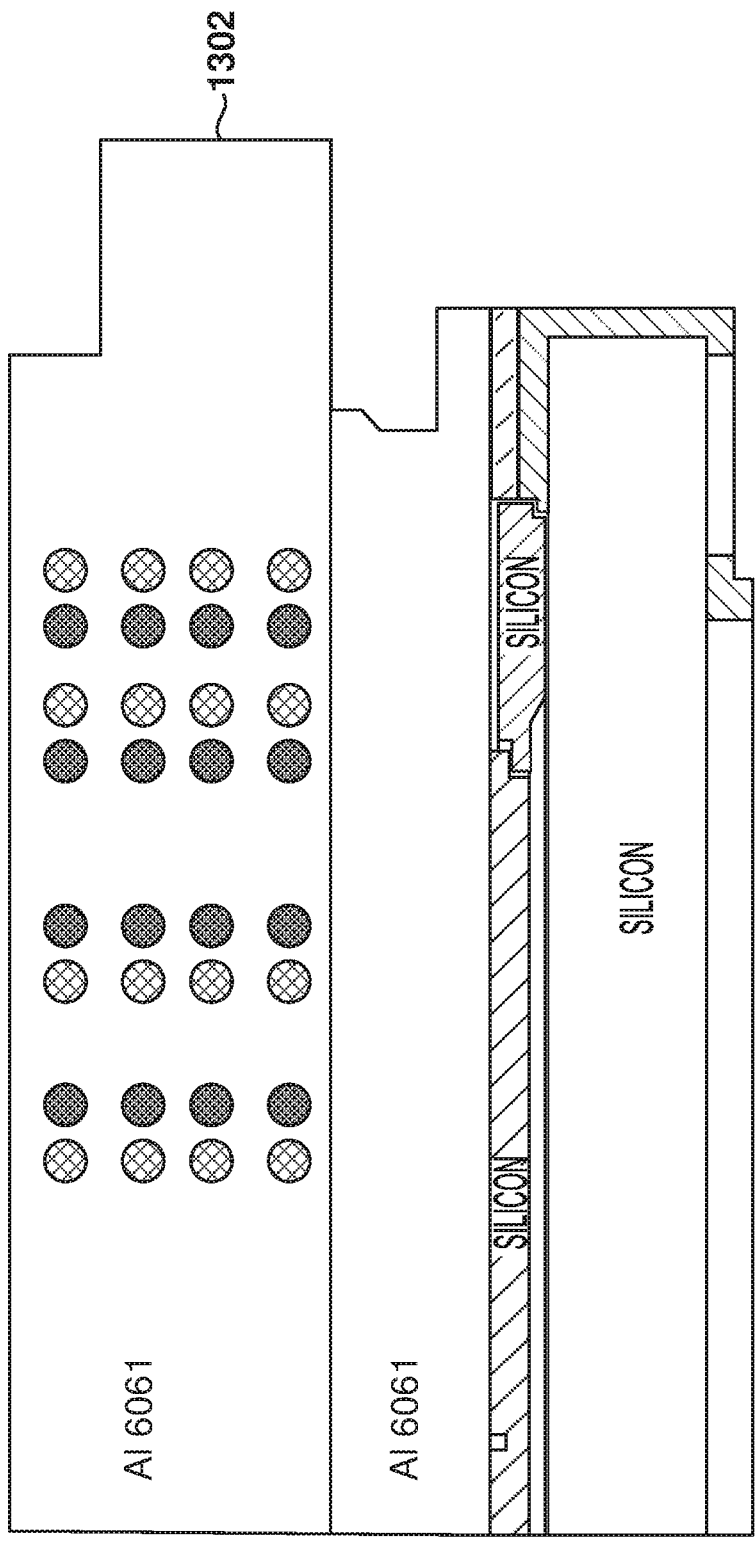
FIG. 13 illustrates the top plate made using solid-state additive manufacturing, according to some example embodiments.

FIG. 13 illustrates a top plate 1302 made using solid-state additive manufacturing, according to some example embodiments. In some example embodiments, the parts on the top plate 1302 are built using solid-state additive manufacturing and adding embedded features such as cooling and heating channels. For example, the baseplate may be of aluminum 6061 and then additional layers are added on top with aluminum 356 or other types of materials.

Using solid-state additive manufacturing techniques such as MELD, the top plate 1302 is created with heaters and coolers in the same layer, which results in bringing the cooling channels closer to the chamber thereby improving the ability to control temperature.

For example, in some semiconductor manufacturing processes, the temperature may fluctuate within a large range, e.g., from cryogenic temperature to a much higher temperature of the coolant. By placing the cooler closer to the chamber, it is possible to cool faster and with less use of energy.

Further, by having an integrated part with embedded channels, the problems of fitting parts together, joining parts together, and keeping the parts in contact with each other are eliminated. For example, the concern of having the bolts tight to keep the parts together disappears. Parts expand and contract based on temperature, and different parts may be at different temperatures, so spaces may be created between the parts. By having an integrated, monolithic part, the problem of parts being separated goes away.

It is noted that the embodiments illustrated in FIG. 13 are examples and do not describe every possible embodiment. Other embodiments may utilize different configuration of heaters and coolers. The embodiments illustrated in FIG. 13 should therefore not be interpreted to be exclusive or limiting, but rather illustrative.

Figure 14:
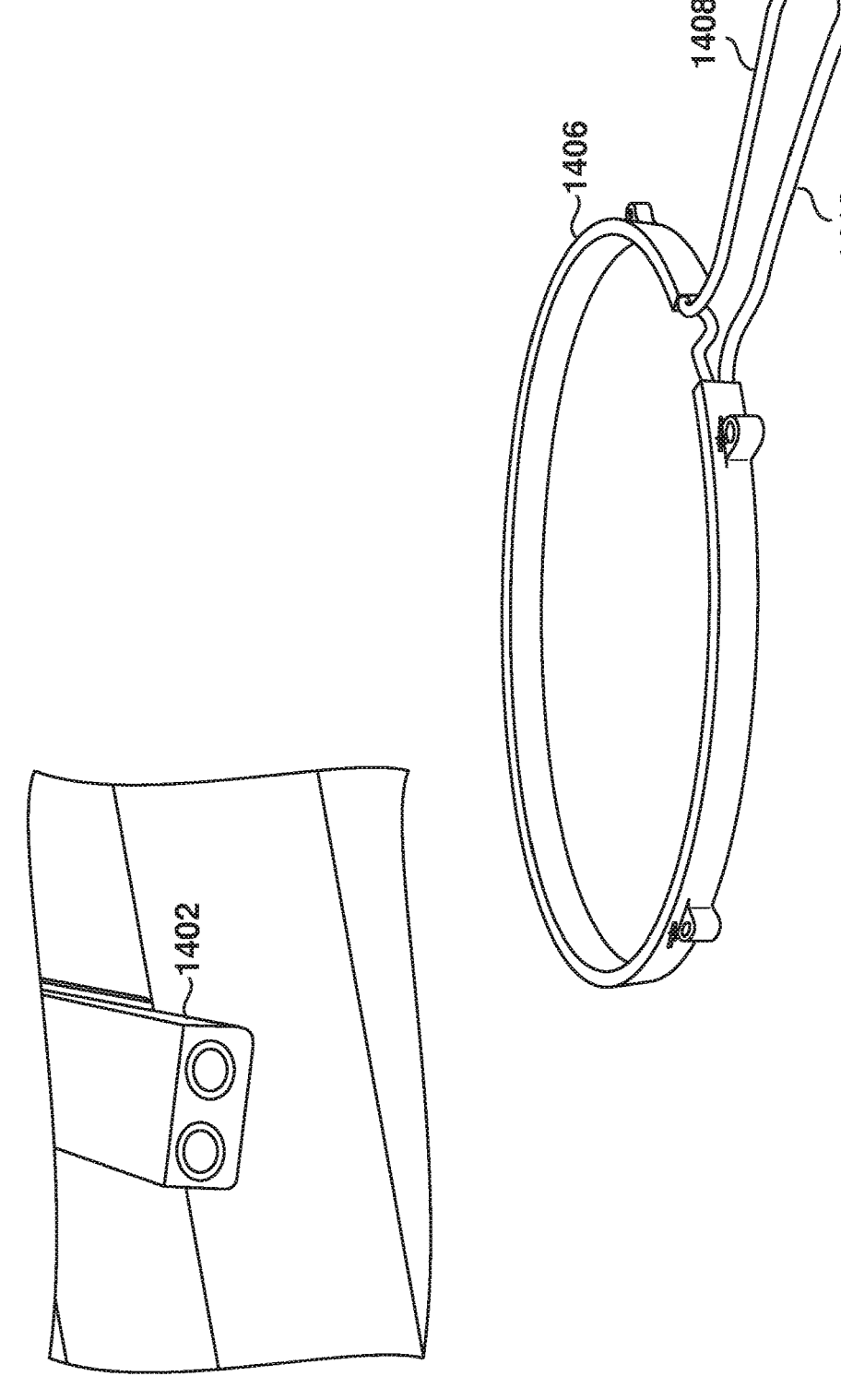
FIG. 14 shows some examples of parts with embedded features.

FIG. 14 shows some examples of parts with embedded features. Part 1402 is a tube with a rectangular cross section and two embedded tubes. The tubes are for cooling and are coated with a layer of a different material than the body. During cooling, water or some other liquid flows through the tube.

Part 1402 may be manufactured with the process illustrated in FIGS. 3 and 4; that is, a channel is grooved into the baseplate and then the feature is covered with friction stir welding. In some example embodiments, part 1402 is made of stainless steel with aluminum 6061 coating in the channel, but other materials may also be used.

Part 1406 is a circular part for cooling, and is similar to part 1402, but curved instead of being straight. The cooling channel enters in a first tube 1408, goes around the circle twice (once on the top and once on the bottom), and exits via tube 1410, or vice versa. The part 1406 also includes some connectors on the side for fastening.

Figure 15:
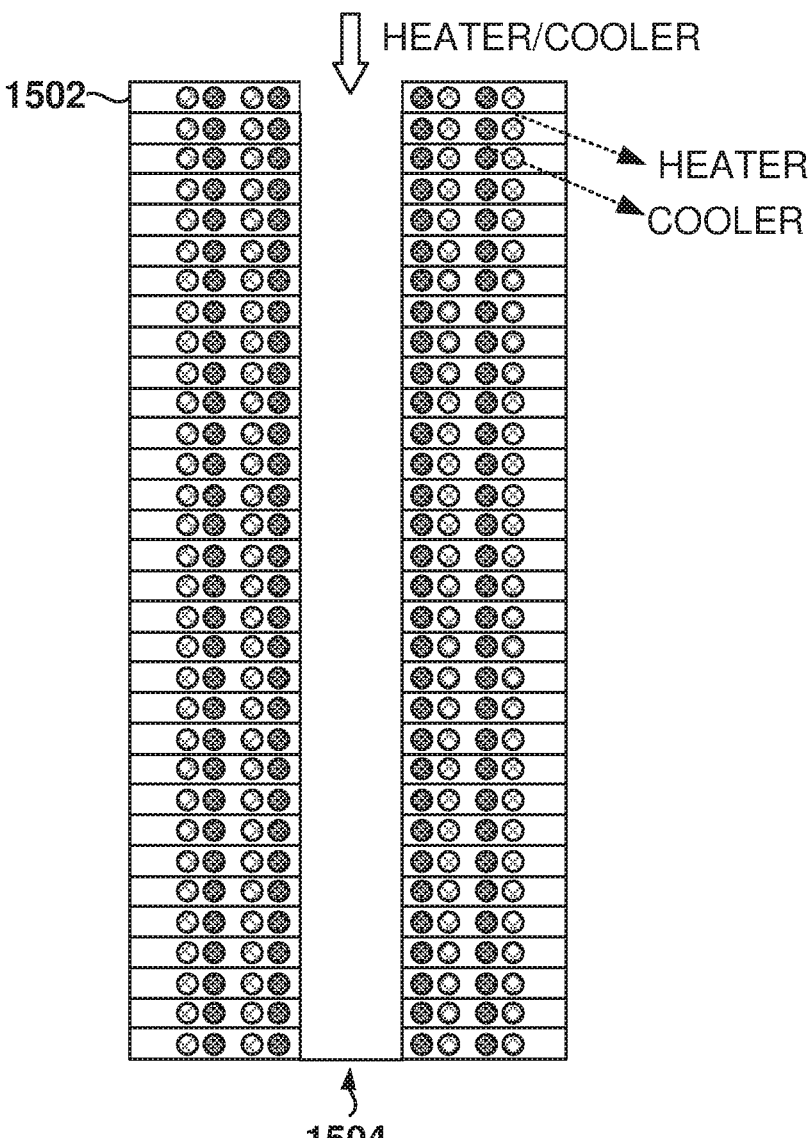
FIG. 15 shows heater and cooler channels in a tube for carrying fluids, according to some example embodiments.

FIG. 15 shows a part 1502 with heater channels, cooler channels, and a tube 1504 through the center for carrying fluids, according to some example embodiments. The heater channels and cooler channels provide temperature control for part 1502 and the tube 1504 may be used to carry fluids (e.g., to control temperature for other parts in the semiconductor manufacturing chamber.

The part 1502 is built via solid-state additive manufacturing, as described before, starting with the baseplate and then adding additional layers with embedded features, where the additional layers are added using MELD. After the layers have been added, the tube is made by drilling through the center.

The part 1502 provides a lot of flexibility for temperature control. For example, the tube 1504 is used to carry gas, and the gas can be heated as the gas travels through the part 1502. Similarly, the gas may be cooled, or a liquid used for cooling may be cooled also as it travels through.

Although part 1502 is illustrated with many layers, the part 1502 may be also built with fewer layers, such as from 1 to 20 layers of embedded cooler or heater channels.

Figure 16:
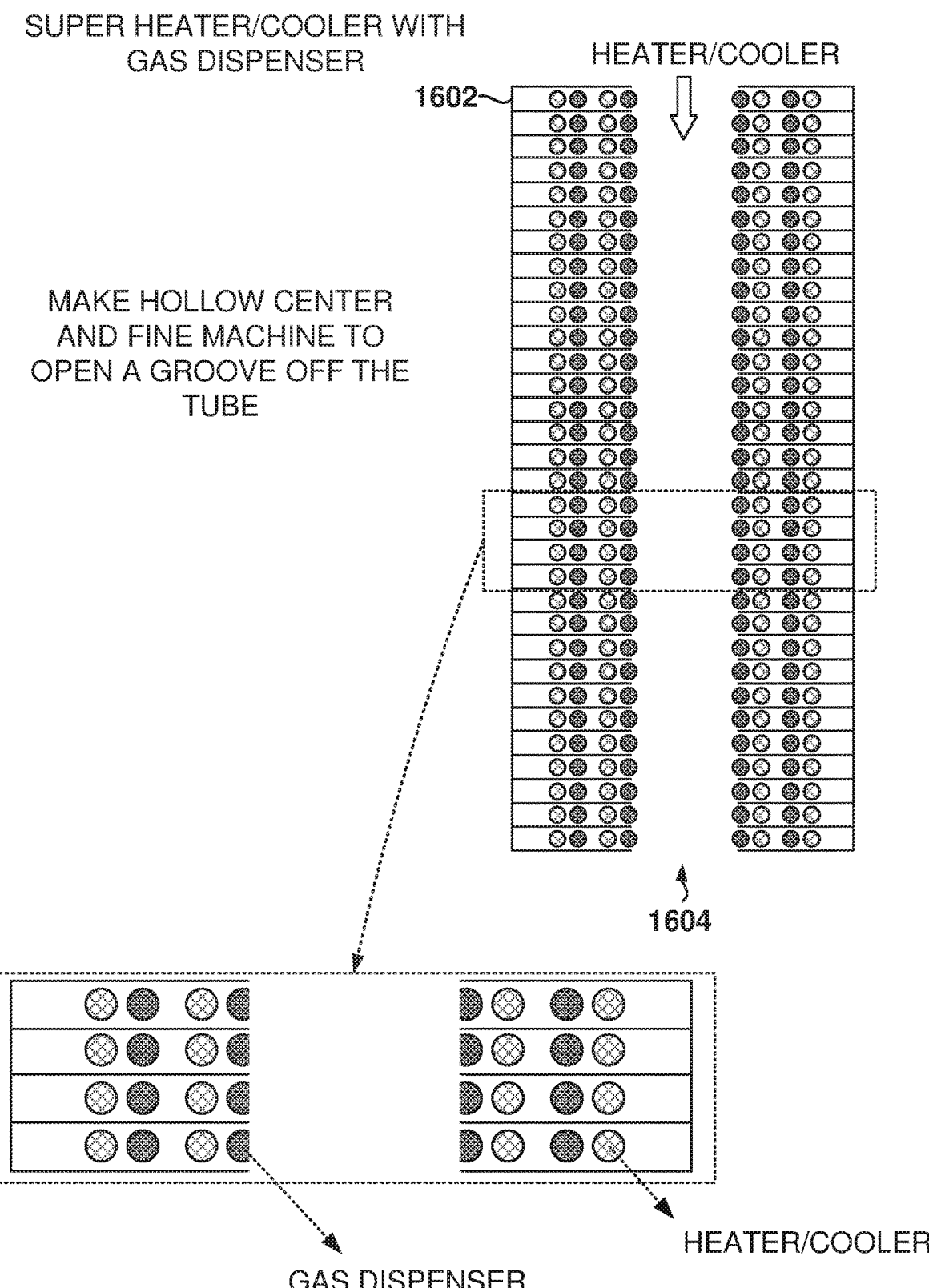
FIG. 16 shows a super heater/cooler with gas dispenser, according to some example embodiments.

FIG. 16 shows a part 1602 with embedded heaters and coolers in a center tube 1604 for dispensing fluids, according to some example embodiments. The part 1602 is manufactured as the part 1502 of FIG. 15, except that the center tube 1604 is drilled such that the drilling perforates the inside channels (that could be heaters or coolers). This way, the tube 1604 may be fed via the embedded features in the center. For example, in some example embodiments, the part 1602 may be closed at the top and then a fluid is introduced in the tube 1604 via the embedded features. The fluid then exits the tube 1604 at the bottom.

Figure 17:
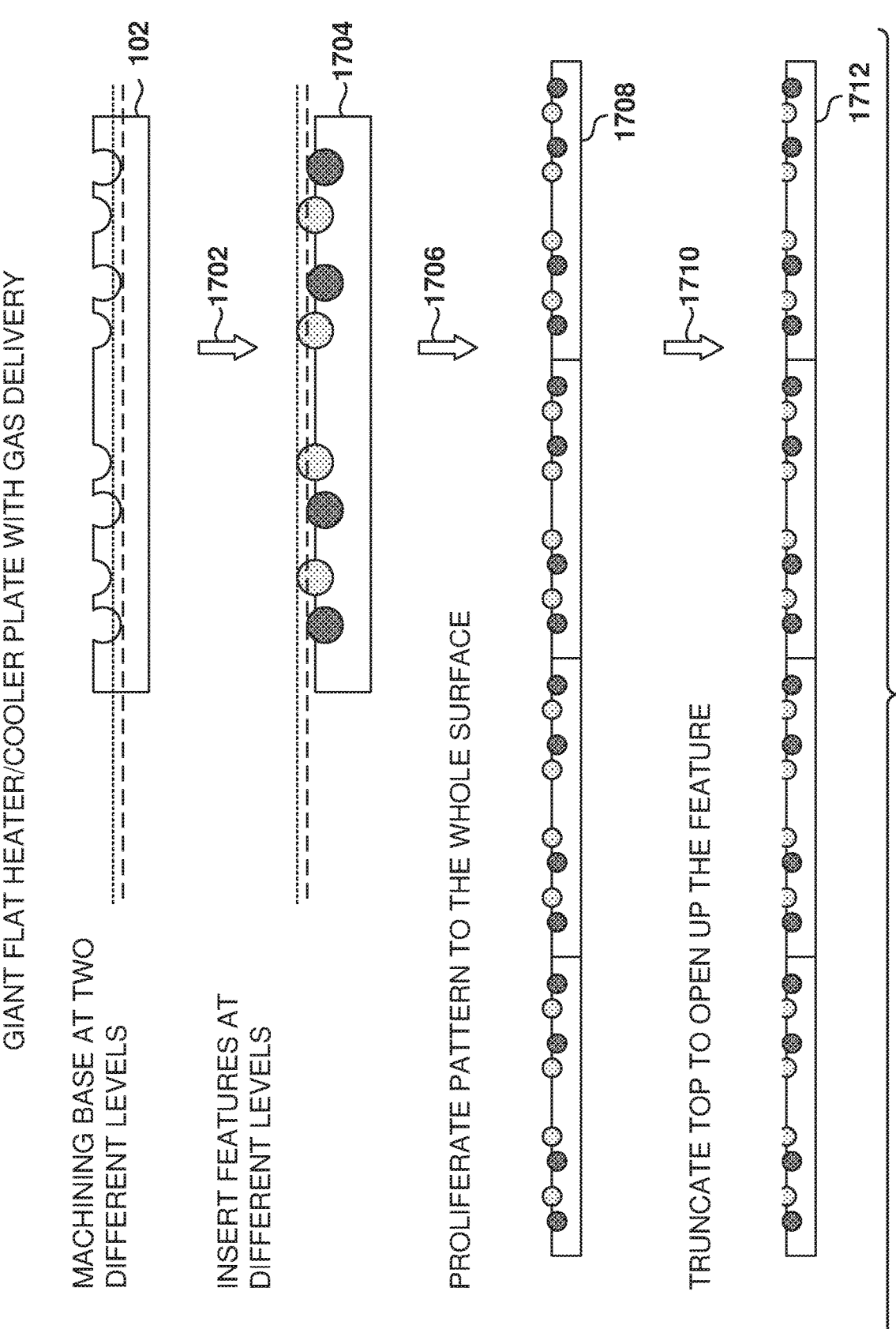
FIG. 17 shows a flat heater/cooler plate with gas delivery, according to some example embodiments.

FIG. 17 shows a flat heater/cooler plate with fluid delivery, according to some example embodiments. Initially, the baseplate 102 is machined with grooves for heating or cooling channels, but the grooves are made at two different heights.

At operation 1702, the features are inserted inside the grooves of the two different levels, resulting in part 1704. At operation 1706, the pattern is proliferated to create a larger piece 1708 with the embedded features.

At operation 1710, the top features are truncated (e.g., clipped), such that the seal of the top features is broken, resulting in part 1712. Part 1712 may then be used to deliver gas via the top feature, while the bottom feature may be used for temperature control (e.g., to heat or cool down).

Figure 18:
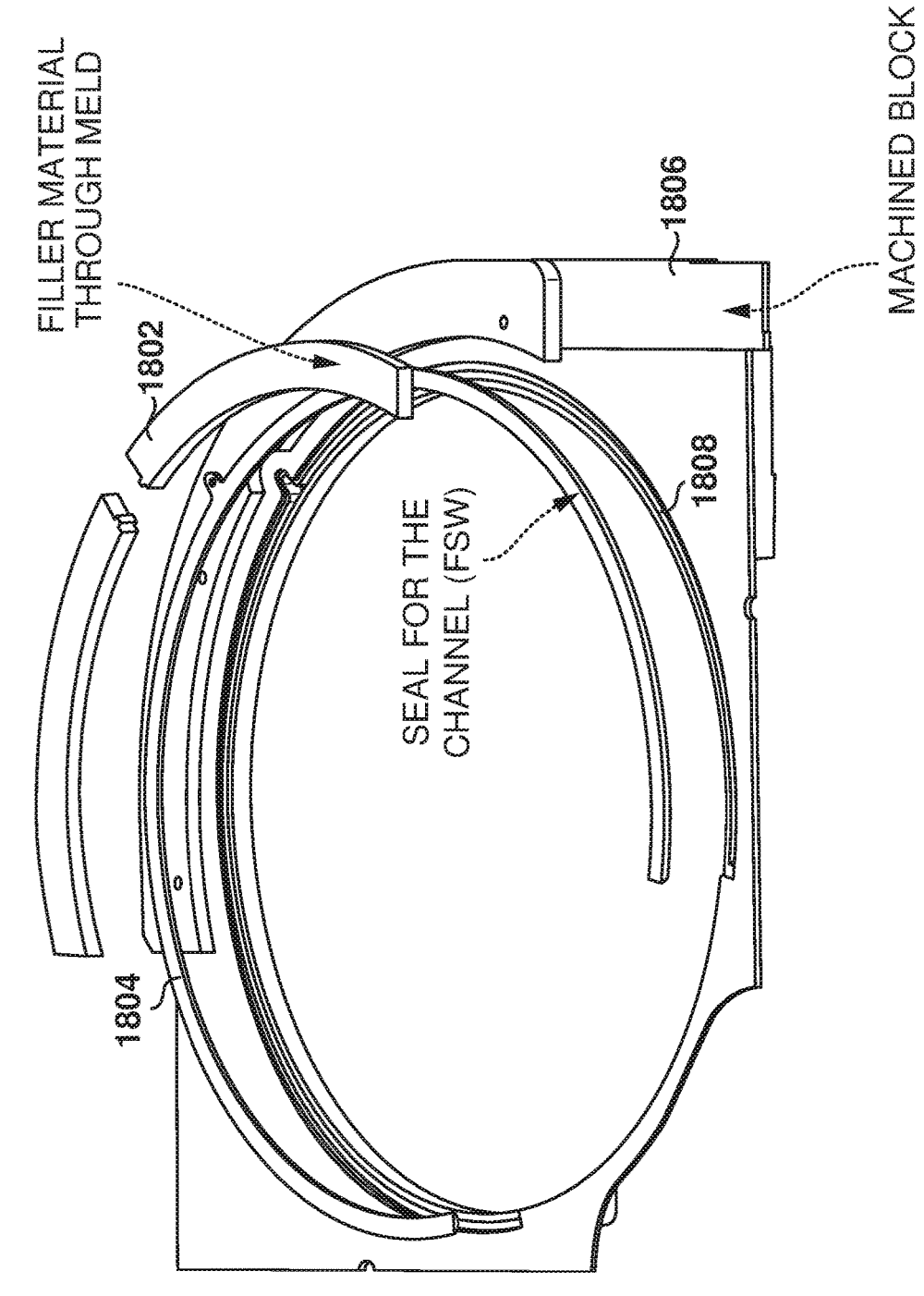
FIG. 18 is an atomic layer deposition (ALD) liner with embedded purge-gas system, according to some example embodiments.

FIG. 18 is an ALD liner 1800 with an embedded purge-gas system, according to some example embodiments. The ALD liner 1800 is made starting with machined block 1806.

A channel 1808 is placed on the ALD liner 1800, where the channel 1808 is used for purging gas from the chamber. Further, friction stir welding is used to create seal 1804 to seal the channel 1808.

Further, filler material 1802 is added above the seal 1804 through solid-state additive manufacturing. The result is the ALD liner 1800 with the embedded channel for purging gas.

Figure 19:
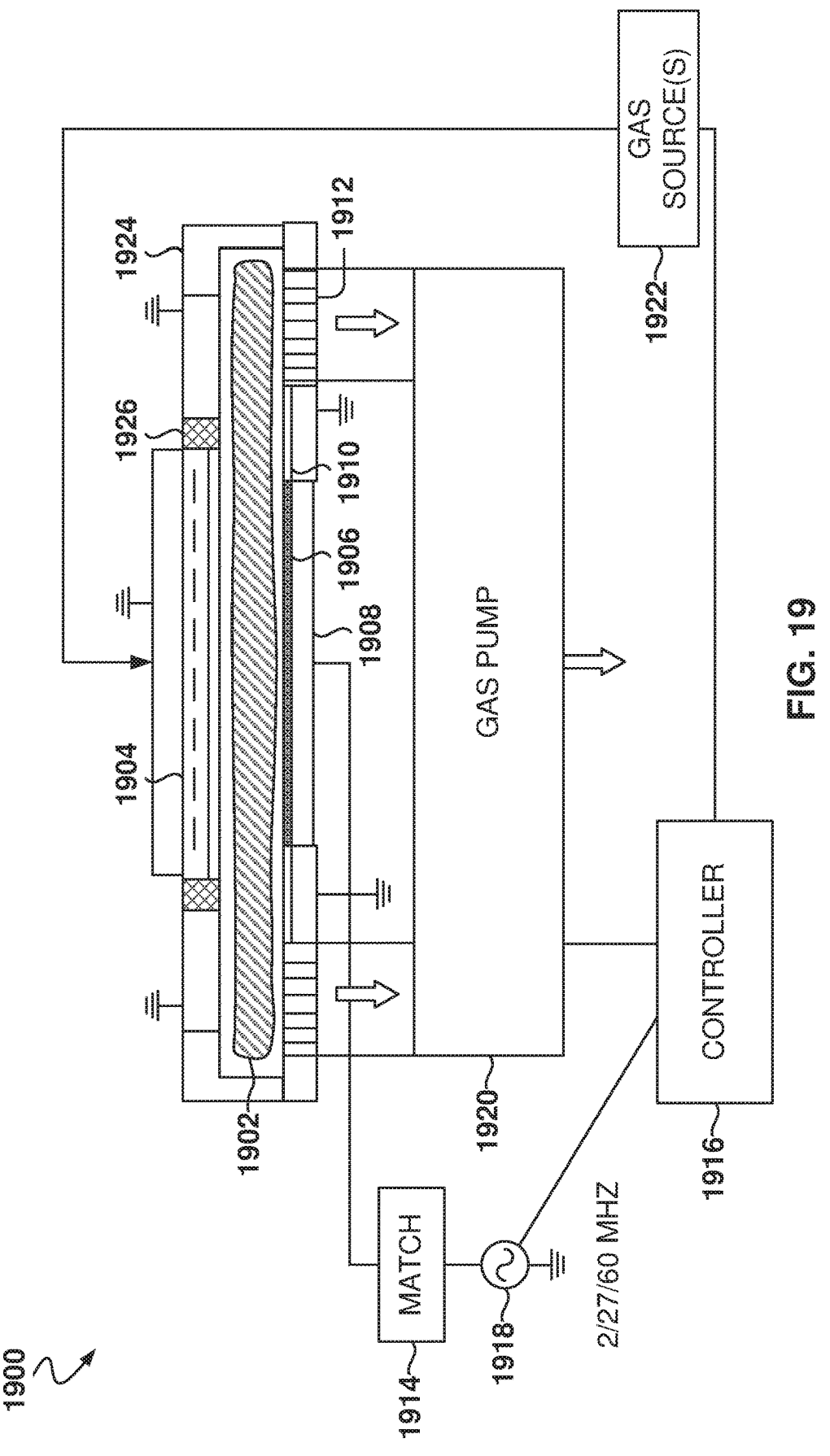
FIG. 19 is an etching chamber, according to some example embodiments.

FIG. 19 shows an etching chamber 1900, according to one embodiment. Exciting an electric field between two electrodes is one of the methods to obtain radiofrequency (RF) gas discharge in an etching chamber. When an oscillating voltage is applied between the electrodes, the discharge obtained is referred to as a Capacitive Coupled Plasma (CCP) discharge.

Plasma 1902 may be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from the chamber walls to strike the substrate surface with enough energy to remove material from the substrate surface. This is known as ion bombardment or ion sputtering. Some industrial plasmas, however, do not produce ions with enough energy to efficiently etch a surface by purely physical means.

A controller 1916 manages the operation of the chamber 1900 by controlling the different elements in the chamber, such as RF generator 1918, gas sources 1922, and gas pump 1920. In one embodiment, fluorocarbon gases, such as $CF_4$ and $C—C_4F_8$, are used in a dielectric etch process for their anisotropic and selective etching capabilities, but the principles described herein can be applied to other plasma-creating gases. The fluorocarbon gases are readily dissociated into chemically reactive by-products that include smaller molecular and atomic radicals. These chemically reactive by-products etch away the dielectric material, which in one embodiment can be $SiO_2$ or SiOCH for low-k devices.

The chamber 1900 illustrates a processing chamber with a top electrode 1904 and a bottom electrode 1908. The top electrode 1904 may be grounded or coupled to an RF generator (not shown), and the bottom electrode 1908 is coupled to RF generator 1918 via matching network 1914. RF generator 1918 provides RF power in one, two, or three different RF frequencies. According to the desired configuration of the chamber 1900 for a particular operation, at least one of the three RF frequencies may be turned on or off. In the embodiment shown in FIG. 19, RF generator 1918 provides 2 MHz, 27 MHz, and 60 MHz frequencies, but other frequencies are also possible.

The chamber 1900 includes a gas showerhead on the top electrode 1904 to input gas into the chamber 1900 provided by gas source(s) 1922 and a perforated confinement ring 1912 that allows the gas to be pumped out of the chamber 1900 by gas pump 1920. In some example embodiments, the gas pump 1920 is a turbomolecular pump, but other type of gas pumps may be utilized.

When substrate 1906 is present in the chamber 1900, silicon focus ring 1910 is situated next to the substrate 1906 such that there is a uniform RF field at the bottom surface of the plasma 1902 for uniform etching on the surface of the substrate 1906. The embodiment of FIG. 19 shows a triode reactor configuration where the top electrode 1904 is surrounded by a symmetric RF ground electrode 1924. Insulator 1926 is a dielectric that isolates ground electrode 1924 from top electrode 1904.

Each frequency may be selected for a specific purpose in the substrate manufacturing process. In the example of FIG. 19, with RF power provided at 2 MHz, 27 MHz, and 60 MHz, the 2 MHz RF power provides ion energy control, and the 27 MHz and 60 MHz power provide control of the plasma density and the dissociation patterns of the chemistry. This configuration, where each RF power may be turned on or off, enables certain processes that use ultra-low ion energy on the substrates or substrates and certain processes (e.g., soft etch for low-k materials) where the ion energy has to be low (under 1900 or 200 eV).

In another embodiment, a 60 MHz RF power is used on the top electrode 1904 to get ultra-low energies and very high density. This configuration allows chamber cleaning with high density plasma when the substrate is not in the chamber 1900, while minimizing sputtering on the electro static chuck (ESC) surface. The ESC surface is exposed when the substrate is not present, and any ion energy on the surface should be avoided, which is why the bottom 2 MHz and 27 MHz power supplies may be off during cleaning.

FIG. 20 is a flowchart of a method 2000 for manufacturing a part with embedded features, used in semiconductor manufacturing equipment, utilizing solid-state additive manufacturing, according to some example embodiments.

Operation 2002 is for machining a first groove along a surface of a baseplate, where the first groove begins on a first end and ends on a second end. The first end and the second end are on a same side of the baseplate.

From operation 2002, the method flows to operation 2004 for placing a first tube on the groove. The first tube covers the groove from the first end to the second end.

From operation 2004, the method flows to operation 2006 for depositing a first layer above the baseplate and the first tube using solid-state additive manufacturing techniques. The first layer completely covers the first tube, where the first tube is configured for carrying a first fluid through the part.

In one example, the solid-state additive manufacturing techniques includes MELD that utilizes a rotating head that applies pressure to a material of the first layer that causes the material to plasticize without reaching a melting point of the material of the first layer.

In one example, the method 2000 further comprises machining a second groove, before placing the first layer, along the surface of the baseplate; and placing a second tube on the second groove before placing the first layer, where the second tube is configured for carrying a second fluid.

In one example, the first tube is configured for heating the part and the second tube is configured for cooling the part.

In one example, the method 2000 further comprises adding additional layers above the first layer.

In one example, the additional layers are made of a plurality of materials.

In one example, the method 2000 further comprises configuring materials of the additional layers to create the part such that the baseplate has different conductivity than a top layer of the part.

In one example, materials for the baseplate and the first layer are selected from a group consisting of aluminum 6061, cast aluminum 356, cast aluminum 367, stainless steel 316L, aluminum alloy, aluminum 3003, aluminum 1050, nickel, Inconel 625, Inconel 718, Haynes C22, tantalum, cadmium, aluminum alloy, and pure aluminum.

In one example, the method 2000 further comprises removing the first tube after depositing the first layer to create a channel in the part.

In yet another general aspect, a machine-readable storage medium (e.g., a non-transitory storage medium) includes instructions that, when executed by a machine, cause the machine to perform operations comprising: machining a first groove along a surface of a baseplate, wherein the first groove begins on a first end and ends on a second end, the first end and the second end being on a same side of the baseplate, the first groove configured for holding a first tube that covers the groove from the first end to the second end; and depositing a first layer above the baseplate and the first tube using solid-state additive manufacturing techniques, the first layer completely covering the first tube, wherein the first tube is configured for carrying a fluid through the part.

Figure 21:
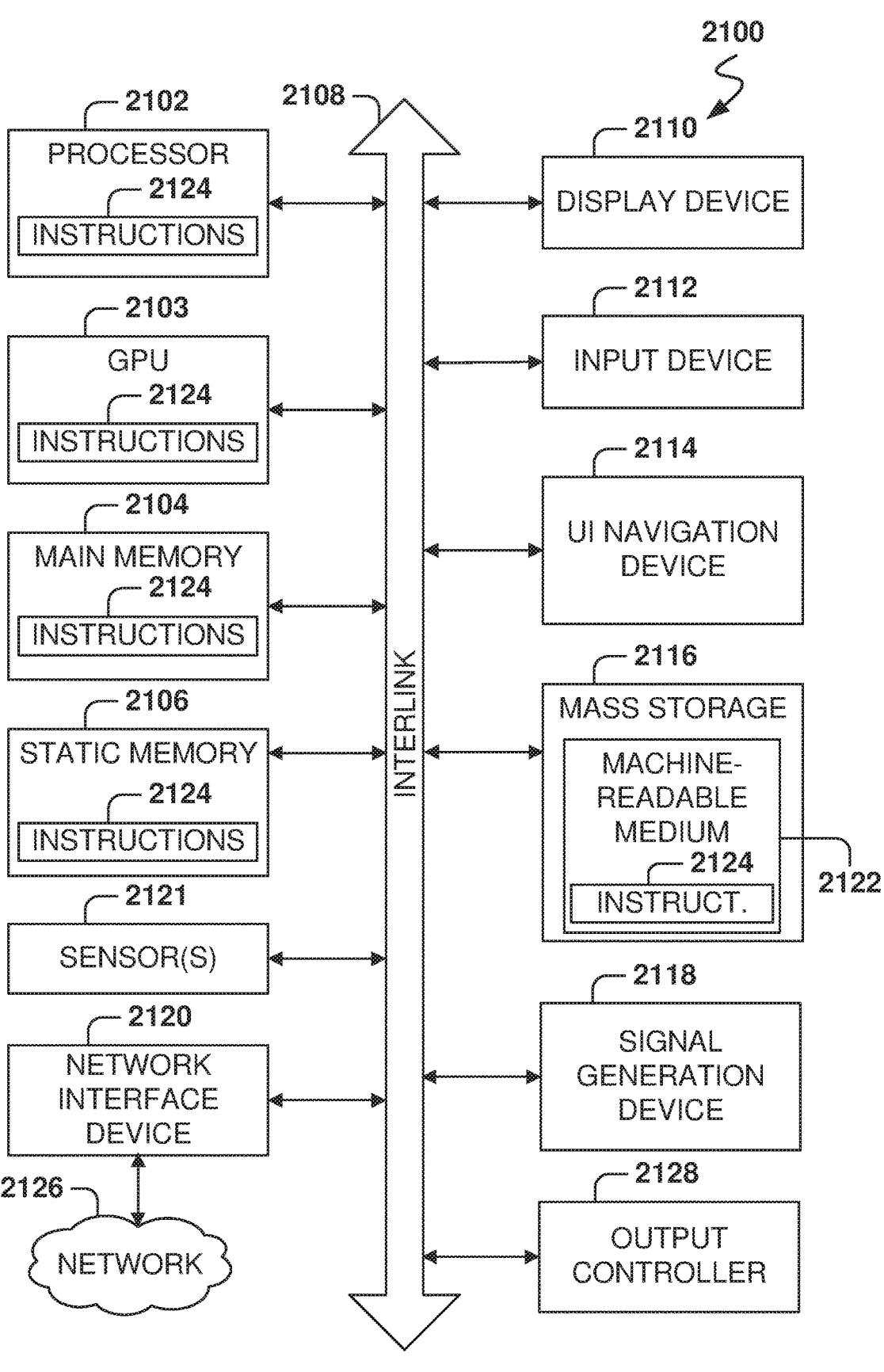
FIG. 21 is a block diagram illustrating an example of a machine 900 upon or by which one or more example process embodiments described herein may be implemented or controlled.

FIG. 21 is a block diagram illustrating an example of a machine 2100 upon or by which one or more example process embodiments described herein may be implemented or controlled. In alternative embodiments, the machine 2100 may operate as a standalone device or may be connected (e.g., networked) to other machines. In a networked deployment, the machine 2100 may operate in the capacity of a server machine, a client machine, or both in server-client network environments. In an example, the machine 2100 may act as a peer machine in a peer-to-peer (P2P) (or other distributed) network environment. Further, while only a single machine 2100 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits) including a computer-readable medium physically modified (e.g., magnetically, electrically, by moveable placement of invariant massed particles) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 2100 may include a hardware processor 2102 (e.g., a central processing unit (CPU), a hardware processor core, or any combination thereof), a graphics processing unit (GPU) 2103, a main memory 2104, and a static memory 2106, some or all of which may communicate with each other via an interlink (e.g., bus) 2108. The machine 2100 may further include a display device 2110, an alphanumeric input device 2112 (e.g., a keyboard), and a user interface (UI) navigation device 2114 (e.g., a mouse). In an example, the display device 2110, alphanumeric input device 2112, and UI navigation device 2114 may be a touch screen display. The machine 2100 may additionally include a mass storage device (e.g., drive unit) 2116, a signal generation device 2118 (e.g., a speaker), a network interface device 2120, and one or more sensors 2121, such as a Global Positioning System (GPS) sensor, compass, accelerometer, or another sensor. The machine 2100 may include an output controller 2128, such as a serial (e.g., universal serial bus (USB)), parallel, or other wired or wireless (e.g., infrared (IR), near field communication (NFC)) connection to communicate with or control one or more peripheral devices (e.g., a printer, card reader).

The mass storage device 2116 may include a machine-readable medium 2122 on which is stored one or more sets of data structures or instructions 2124 (e.g., software) embodying or utilized by any one or more of the techniques or functions described herein. The instructions 2124 may also reside, completely or at least partially, within the main memory 2104, within the static memory 2106, within the hardware processor 2102, or within the GPU 2103 during execution thereof by the machine 2100. In an example, one or any combination of the hardware processor 2102, the GPU 2103, the main memory 2104, the static memory 2106, or the mass storage device 2116 may constitute machine-readable media.

While the machine-readable medium 2122 is illustrated as a single medium, the term "machine-readable medium" may include a single medium, or multiple media, (e.g., a centralized or distributed database, and/or associated caches and servers) configured to store the one or more instructions 2124.

The term "machine-readable medium" may include any medium that is capable of storing, encoding, or carrying instructions 2124 for execution by the machine 2100 and that cause the machine 2100 to perform any one or more of the techniques of the present disclosure, or that is capable of storing, encoding, or carrying data structures used by or associated with such instructions 2124. Non-limiting machine-readable medium examples may include solid-state memories, and optical and magnetic media. In an example, a massed machine-readable medium comprises a machine-readable medium 2122 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 2124 may further be transmitted or received over a communications network 2126 using a transmission medium via the network interface device 2120.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

Additional Embodiments for a Pedestal

A1. A method for manufacturing a pedestal for a semiconductor manufacturing system, the method comprising:

providing a baseplate of a first material;

machining a groove along a surface of a baseplate, wherein the groove begins on a first end and ends on a second end of the baseplate;

placing a tube on the groove, the tube covering the groove from the first end to the second end; and depositing a top layer of a second material above the baseplate and the tube using solid-state additive manufacturing techniques, the top layer completely covering the tube, wherein the tube is configured for carrying a fluid.

A2. The method as recited in claim A1, wherein the second material has better chemical resistance than the first material when the pedestal is used in a semiconductor manufacturing system.

A3. The method as recited in claim A1, wherein the first material is aluminum 6061 alloy.

A4. The method as recited in claim A1, wherein the second material is aluminum alloy or pure aluminum.

A5. The method as recited in claim A1, wherein depositing the top layer comprises:

supplying a third material and a fourth material simultaneously during the solid-state additive manufacturing; and combining the third material and the fourth material during the solid-state additive manufacturing to generate the second material deposited above the baseplate.

A6. The method as recited in claim A5, wherein the third material is aluminum and the fourth material is aluminum fluoride.

A7. The method as recited in claim A5, wherein depositing the top layer further comprises:

adding a binder material during the solid-state additive manufacturing.

A8. The method as recited in claim A7, wherein the binder material is aluminum fluoride.

A9. The method as recited in claim A1, wherein the first end and the second end are on a same side of the baseplate.

A10. The method as recited in claim A1, wherein the first material has a higher coefficient of linear thermal expansion (CTE) than the second material.

A11. The method as recited in claim A1, wherein the tube is for conducting heating material through the pedestal during operation of the semiconductor manufacturing system.

A12. The method as recited in claim A1, wherein the solid-state additive manufacturing techniques includes MELD that utilizes a rotating head that applies pressure to the first material of the baseplate causing the first material to plasticize without reaching a melting point of the first material.

A13. A system for manufacturing a showerhead for a semiconductor manufacturing system, the system comprising:

a solid-state additive manufacturing device;

a memory comprising instructions; and one or more computer processors, wherein the instructions, when executed by the one or more computer processors, cause the system to perform operations comprising:

depositing, using the solid-state additive manufacturing device, on a baseplate of a first material, a top layer of a second material to create a pedestal, the baseplate having a groove along a surface of a baseplate, wherein the groove begins on a first end and ends on a second end of the baseplate, the groove having a tube covering the groove from the first end to the second end, wherein the top layer completely covers the tube that is configured for carrying a fluid.

A14. The system as recited in claim A13, wherein the second material has better chemical resistance than the first material when the pedestal is used in a semiconductor manufacturing system.

A15. The system as recited in claim A13, wherein the first material is aluminum 6061 alloy.

A16. The system as recited in claim A13, wherein the second material is aluminum alloy or pure aluminum.

A17. The system as recited in claim A13, wherein depositing the top layer comprises:

supplying a third material and a fourth material simultaneously during the solid-state additive manufacturing; and combining the third material and the fourth material during the solid-state additive manufacturing to generate the second material deposited above the baseplate.

A18. The system as recited in claim A17, wherein the third material is aluminum and the fourth material is aluminum fluoride.

A19. The system as recited in claim A17, wherein depositing the top layer further comprises:

adding a binder material during the solid-state additive manufacturing.

A20. The system as recited in claim A19, wherein the binder material is aluminum fluoride.

Additional embodiments manufacturing a part with an embedded feature:

B1. A method for manufacturing a part with an embedded feature, the method comprising:

machining a first groove along a surface of a baseplate, wherein the first groove begins on a first end and ends on a second end, the first end and the second end being on a same side of the baseplate;

placing a first tube on the first groove, the first tube covering the first groove from the first end to the second end; and depositing a first layer above the baseplate and the first tube using solid-state additive manufacturing techniques, the first layer completely covering the first tube, wherein the first tube is configured for carrying a first fluid.

B2. The method as recited in claim B1, wherein the solid-state additive manufacturing techniques includes MELD that utilizes a rotating head that applies pressure to a material of the first layer causing the material to plasticize without reaching a melting point of the material of the first layer.

B3. The method as recited in claim B1, further comprising:

machining a second groove, before placing the first layer, along the surface of the baseplate; and placing a second tube on the second groove before placing the first layer, wherein the second tube is configured for carrying a second fluid.

B4. The method as recited in claim B3, wherein the first tube is configured for heating the part and the second tube is configured for cooling the part.

B5. The method as recited in claim B1, further comprising:

adding additional layers above the first layer.

B6. The method as recited in claim B5, wherein the additional layers are made of a plurality of materials.

B7. The method as recited in claim B6, further comprising:

configuring materials of the additional layers to create the part such that the baseplate has different conductivity than a top layer of the part.

B8. The method as recited in claim B1, wherein materials for the baseplate and the first layer are selected from a group consisting of aluminum 6061, cast aluminum 356, cast aluminum 367, stainless steel 316L, aluminum alloy, aluminum 3003, aluminum 1050, nickel, Inconel 625, Inconel 718, Haynes C22, tantalum, cadmium, and pure aluminum.

B9. A system for manufacturing a part with an embedded feature, the system comprising:

a solid-state additive manufacturing device;

a memory comprising instructions; and one or more computer processors, wherein the instructions, when executed by the one or more computer processors, cause the system to perform operations comprising:

depositing, using the solid-state additive manufacturing device, a first layer on a baseplate, the baseplate having a first groove along a surface of the baseplate, wherein the first groove begins on a first end and ends on a second end, the first end and the second end being on a same side of the baseplate, the first groove having a first tube covering the first groove from the first end to the second end, wherein the depositing completely covers the first tube, wherein the first tube is configured for carrying a first fluid.

B10. The system as recited in claim B9, wherein the solid-state additive manufacturing techniques includes MELD that utilizes a rotating head that applies pressure to a material of the first layer causing the material to plasticize without reaching a melting point of the material of the first layer.

B11. The system as recited in claim B9, wherein the instructions further cause the one or more computer processors to perform operations comprising:

adding additional layers above the first layer.

B12. The system as recited in claim B11, wherein the additional layers are made of a plurality of materials.

B13. The system as recited in claim B12, wherein materials of the additional layers are configured to create the part such that the part has different conductivity than a top layer of the part.

B14. The system as recited in claim B9, wherein materials for the baseplate and the first layer are selected from a group consisting of aluminum 6061, cast aluminum 356, cast aluminum 367, stainless steel 316L, aluminum alloy, aluminum 3003, aluminum 1050, nickel, Inconel 625, Inconel 718, Haynes C22, tantalum, cadmium, and pure aluminum.

Additional Embodiments for Manufacturing a Part with an Embedded Channel

C1. A method for manufacturing a part with an embedded channel, the method comprising:

machining a first groove along a surface of a base of a first material;

filling the first groove with a second material;

depositing, using solid-state additive manufacturing techniques, a first layer of a third material above the base and the filled first groove, the first layer covering the first groove; and creating, after depositing the first layer, the embedded channel in the part by removing the second material.

C2. The method as recited in claim C1, wherein the second material is a boiler-type plastic, wherein removing the second material comprises:

placing the part in a furnace to evaporate the boiler-type plastic.

C3. The method as recited in claim C1, wherein the second material is a water-dissolvable salt, wherein removing the second material comprises:

submerging the part into water to dissolve the water-dissolvable salt.

C4. The method as recited in claim C1, wherein the solid-state additive manufacturing techniques includes MELD that utilizes a rotating head that applies pressure to the first material and the second material causing the first material to plasticize without reaching a melting point.

C5. The method as recited in claim C1, further comprising:

adding additional layers above the first layer.

C6. The method as recited in claim C5, wherein the additional layers are made of a plurality of materials.

C7. The method as recited in claim C6, further comprising:

configuring materials of the additional layers to create the part such that the base has a different conductivity than a top layer of the part.

C8. The method as recited in claim C1, wherein the first material for the base is selected from a group consisting of aluminum 6061, cast aluminum 356, cast aluminum 367, stainless steel 316L, aluminum alloy, aluminum 3003, aluminum 1050, nickel, Inconel 625, Inconel 718, Haynes C22, tantalum, cadmium, and pure aluminum.

C9. The method as recited in claim C1, wherein the first material is aluminum 6061 alloy and the third material is aluminum alloy or pure aluminum.

C10. The method as recited in claim C1, wherein the third material is nickel.

C11. The method as recited in claim C11, wherein the third material is tantalum.

C12. A system for manufacturing a part with an embedded channel, the system comprising:

a solid-state additive manufacturing device;

a memory comprising instructions; and one or more computer processors, wherein the instructions, when executed by the one or more computer processors, cause the system to perform operations comprising:

depositing, using the solid-state additive manufacturing device, on a base of a first material that has a first groove filled with a second material, a first layer of a third material, wherein the part with the embedded channel is created by removing the second material after the depositing.

C13. The system as recited in claim C12, wherein the second material is a boiler-type plastic, wherein removing the second material comprises:

placing the part in a furnace to evaporate the boiler-type plastic.

C14. The system as recited in claim C12, wherein the second material is a water-dissolvable salt, wherein removing the second material comprises:

submerging the part into water to dissolve the water-dissolvable salt.

C15. The system as recited in claim C12, wherein the solid-state additive manufacturing techniques includes MELD that utilizes a rotating head that applies pressure to the first material and the second material causing the first material to plasticize without reaching a melting point.

C16. The system as recited in claim C12, wherein the instructions further cause the one or more computer processors to perform operations comprising:

adding additional layers above the first layer.

C17. The system as recited in claim C16, wherein the additional layers are made of a plurality of materials.

C18. The system as recited in claim C17, wherein materials of the additional layers are configured to create the part such that the base has a different conductivity than a top layer of the part.

C19. The system as recited in claim C12, wherein the first material for the base is selected from a group consisting of aluminum 6061, cast aluminum 356, cast aluminum 367, stainless steel 316L, aluminum alloy, aluminum 3003, aluminum 1050, nickel, Inconel 625, Inconel 718, Haynes C22, tantalum, cadmium, and pure aluminum.

C20. The system as recited in claim C12, wherein the first material is aluminum 6061 alloy and the third material is aluminum alloy or pure aluminum.

The invention claimed is:

1. A showerhead used in a semiconductor manufacturing system, the showerhead produced by a method comprising:

drilling first holes on a faceplate made of a first material, the first holes having a first diameter;

cladding the first holes and the faceplate with a second material to cover the first holes and the faceplate with the second material, the cladding including applying solid-state additive manufacturing over the first holes thereby filling the first holes with the second material, the second material being selected from a material that is different from the first material, the second material being at least one material selected from materials including a metal and a metal alloy, the solid-state additive manufacturing including additive manufacturing utilizing a rotating head to apply pressure to the second material of the faceplate thereby causing the second material to plasticize without reaching a melting point of the second material, the applied solid-state additive manufacturing over the first holes to fill the first holes with the second material to a predetermined depth;

drilling second holes concentric with and within the first holes resulting in a part with holes coated with the second material, the second material surrounding a surface perimeter within the second hole, the second holes having a second diameter that is smaller than the first diameter; and creating the showerhead utilizing the part, the second holes of the faceplate being configured to deliver one or more semiconductor-process gases therethrough.

2. The showerhead as recited in claim 1, wherein the first material is an aluminum alloy with less than 98.9 mass percentage content of aluminum, and wherein the second material is pure aluminum or an aluminum alloy with at least 99 mass percentage content of aluminum.

3. The showerhead as recited in claim 1, wherein the first holes have a diameter in a range from 60 μm to 3 mm, and the second holes have a diameter in a range from 40 μm to 0.5 millimeter, with a difference between the diameters of the first holes and the diameters of the second holes of at least 10 μm.

4. The showerhead as recited in claim 1, wherein the coating of the surface perimeter of the holes of the second material has a thickness in the range of 50 μm to 2 mm.

* * * * *